(12) United States Patent
Kopriva et al.

(10) Patent No.: US 8,165,373 B2
(45) Date of Patent: Apr. 24, 2012

(54) METHOD OF AND SYSTEM FOR BLIND EXTRACTION OF MORE PURE COMPONENTS THAN MIXTURES IN 1D AND 2D NMR SPECTROSCOPY AND MASS SPECTROMETRY COMBINING SPARSE COMPONENT ANALYSIS AND SINGLE COMPONENT POINTS

(75) Inventors: Ivica Kopriva, Zagreb (HR); Ivanka Jeric, Zagreb (HR)

(73) Assignee: Rudjer Boskovic Institute (HR)

( * ) Notice: Subject to any disclaimer, the term of this patent is extended or adjusted under 35 U.S.C. 154(b) by 0 days.

(21) Appl. No.: 13/090,951

(22) Filed: Apr. 20, 2011

(65) Prior Publication Data

US 2011/0229001 A1  Sep. 22, 2011

Related U.S. Application Data

(63) Continuation of application No. PCT/HR2009/000028, filed on Sep. 10, 2009.

(51) Int. Cl.
*G06K 9/00* (2006.01)
*G06K 9/46* (2006.01)
*G06K 9/36* (2006.01)

(52) U.S. Cl. .................. 382/128; 382/240; 382/280

(58) Field of Classification Search .......... 382/128–134, 382/224, 225, 232–253, 276, 279, 280, 281; 356/73.1–300, 302, 303, 319, 326; 506/6; 805/9, 27
See application file for complete search history.

(56) References Cited

U.S. PATENT DOCUMENTS

| | | | |
|---|---|---|---|
| 5,706,402 | A | 1/1998 | Bell |
| 6,577,966 | B2 | 6/2003 | Balan et al. |
| 6,944,579 | B2 | 9/2005 | Shimizu |
| 7,010,514 | B2 | 3/2006 | Mackawa et al. |
| 7,280,943 | B2 | 10/2007 | Zador et al. |
| 7,295,972 | B2 | 11/2007 | Choi |

(Continued)

FOREIGN PATENT DOCUMENTS

CN  1932849 A  3/2007

(Continued)

OTHER PUBLICATIONS

Chang, et al.; "A Fast Iterative Algorithm for Implementation of Pixel Purity Index"; IEEE Geoscience and Remote Sensing Letters; vol. 3 No. 1; Jan. 1, 2006; pp. 63-67.

(Continued)

*Primary Examiner* — Brian Le
(74) *Attorney, Agent, or Firm* — St. Onge Steward Johnston & Reens LLC

(57) ABSTRACT

A computer-implemented data processing system for blind extraction of more pure components than mixtures recorded in 1D or 2D NMR spectroscopy and mass spectrometry. Sparse component analysis is combined with single component points (SCPs) to blind decomposition of mixtures data X into pure components S and concentration matrix A, whereas the number of pure components S is greater than number of mixtures X. NMR mixtures are transformed into wavelet domain, where pure components are sparser than in time domain and where SCPs are detected. Mass spectrometry (MS) mixtures are extended to analytical continuation in order to detect SCPs. SCPs are used to estimate number of pure components and concentration matrix. Pure components are estimated in frequency domain (NMR data) or m/z domain (MS data) by means of constrained convex programming methods. Estimated pure components are ranked using negentropy-based criterion.

19 Claims, 23 Drawing Sheets

U.S. PATENT DOCUMENTS

| | | | |
|---|---|---|---|
| 7,840,625 B2* | 11/2010 | Candes et al. | 708/402 |
| 2003/0088384 A1 | 5/2003 | Hori et al. | |
| 2004/0111220 A1 | 6/2004 | Ochs et al. | |
| 2005/0032231 A1 | 2/2005 | Smaragdis | |
| 2006/0058983 A1 | 3/2006 | Araki et al. | |
| 2006/0064299 A1 | 3/2006 | Uhle et al. | |
| 2006/0256978 A1 | 11/2006 | Balan et al. | |
| 2007/0004966 A1 | 1/2007 | Yoshino | |
| 2007/0252597 A1 | 11/2007 | Posse | |
| 2007/0257840 A1 | 11/2007 | Wang et al. | |
| 2008/0147763 A1 | 6/2008 | Levin | |
| 2009/0232349 A1* | 9/2009 | Moses et al. | 382/100 |

FOREIGN PATENT DOCUMENTS

| | | | |
|---|---|---|---|
| WO | 9617309 A1 | 6/1996 | |
| WO | 03090127 A1 | 10/2003 | |
| WO | 2007103037 A2 | 9/2007 | |
| WO | 2007112597 A1 | 10/2007 | |
| WO | 2007138544 A2 | 12/2007 | |
| WO | 2008076680 A2 | 6/2008 | |
| WO | 2010058230 A2 | 5/2010 | |

OTHER PUBLICATIONS

J. Chen, X.Z. Wang, "A New Approach to Near-Infrared Spectral Data Analysis Using Independent Component Analysis," J. Chem. Inf. Comput. Sci. 41, 992-1001, 2001.

Zhang, et al.; "A New Two-Stage Approach to Underdetermined Blind Source Separation Using Sparse Representation"; IEEE 2007; pp. 953-956.

G. Wang, W. Cai, X. Shao, "A primary study on resolution of overlapping GC-MS signal using mean-field approach independent component analysis," Chemometrics and Intelligent Laboratory Systems 82, 137-144, 2006.

Cichocki, et al.; "Adaptive Blind Signal and Image Processing—Learning Algorithms and Applications"; John Wiley & Sons, Ltd.; Copyright 2002; 587 pages.

Reju, et al.; "An Algorithm for Mixing Matrix Estimation in Instantaneous Blind Source Separation"; Signal Processing, Elsevier Science Publishers B.V. vol. 89, No. 9, Sep. 1, 2009, pp. 1762-1773.

A. J. Bell and T. J. Sejnowski. "An information-maximization approach to blind separation and blind deconvolution."; Neural Computation; vol. 7, pp. 1129-1159, 1995.

S.J. Kim et al., "An Interior-Point Method for Large-Scale l1-Regularized Least Squares," IEEE Journal of Selected Topics in Signal Processing, vol. 1, No. 4, 606-617, 2007.

Y. Li, A. Cichocki, S. Amari, "Analysis of Sparse Representation and Blind Source Separation," Neural Computation 16, pp. 1193-1234, 2004.

D. Nuzillard, J.-M. Nuzzilard, "Application of Blind Source Separation to 1-D and 2-D Nuclear Magnetic Resonance Spectroscopy," IEEE Signal Processing Letters, vol. 5, No. 8, 209-211, 1998.

Kopriva, et al.; "Blind Decomposition of Infrared Spectra Using Flexible Component Analysis"; Chemometrics and Intelligent Laboratory Systems, Elsevier Science Publishers; vol. 97, No. 2; Jul. 15, 2009; pp. 170-178.

Kopriva, et al.; "Blind Separation of Analytes in Nuclear Magnetic Resonance Spectroscopy and Mass Spectrometry: Sparseness-Based Robust Multicomponent Analysis"; Anal Chem., vol. 82 Mar. 1, 2010; pp. 1911-1920.

A. Jourjine, S. Rickard, and O. Yilmaz,"Blind Separation of Disjoint Orthogonal Signals: Demixing n sources from 2 mixtures"; Proc. Int. Conf. on Acoust., Speech, Signal Processing, 2000, vol. 5, pp. 2985-2988.

W. Naanaa, J.-M. Nuzzilard, "Blind source separation of positive and partially correlated data," Signal Processing 85, 1711-1722, 2005.

F. Westad, M. Kermit, "Cross validation and uncertainty estimates in independent component analysis," Analytica Chimica Acta 490, 341-354, 2003.

Gahn, et al.; Data Clustering—Theory Algorithms and Applications ASA SIAM Series on Statistics and Applied Probability; 2007; 488 pages.

J.M.P. Nascimento, J.M. Bioucas Dias, "Does Independent Component Analysis Play a Role in Unmixing Hyperspectral Data?," IEEE Transactions on Geoscience and Remote Sensing 43, 175-187, 2005.

F M Naini, G H Mohimani, M. Babaie-Zadeh, Ch. Jutten, "Estimating the mixing matrix in Sparse Component Analysis (SCA) based on partial k-dimensional subspace clustering," Neurocomputing 71, 2330-2343, 2008.

E. Levina et al., "Estimating the number of pure chemical components in a mixture by maximum likelihood," Journal of Chemometrics 21, 24-34, 2007.

X. Shao, G. Wang, S. Wang, Q. Su, "Extraction of Mass-Spectra and Chromatographic Profiles from Overlapping GC/MS Signal with Background," Analytical Chemistry 76, 5143-5148, 2004.

J.Y. Ren, et al., "Free radical EPR spectroscopy analysis using blind source separation," Journal of Magnetic Resonance 166, 82-91, 2004.

Wang, et al.; "Independent Component Analysis and its Applications in Signal Processing for Analytical Chemistry"; Trends in Analytical Chemistry, vol. XX, No. X, 2007; pp. 1-9.

A. Hyvärinen, J. Karhunen, E. Oja. Independent Component Analysis, John Wiley, 2001; 505 pages.

International Search Report and Written Opinion of the International Searching Authority; PCT/HR2009/000028; Mar. 5, 2010; 17 pages.

V.A. Shashilov et al., "Latent variable analysis of Raman spectra for structural characterization of proteins," Journal of Quantitative Spectroscopy & Radiative Transfer 102, 46-61, 2006.

M.S. Lewicki et. al., "Learning Overcomplete Representations," Neural Computation, vol. 12, pp. 337-365, 2000.

J. W. Boardman, F. A. Kruse, and R. O. Green, "Mapping target signatures via partial unmixing of AVIRIS data" in Summaries of JPL Airborne Earth Science Workshop, Pasadena, CA, 1995; pp. 23-26.

D. Nuzillard, S. Bourg and J.-M. Nuzillard, "Model-Free Analysis of Mixtures by NMR Using Blind Source Separation," Journal of Magnetic Resonance 133, 358-363, 1998.

Kopriva, et al.; "Multi-Component Analysis: Blind Extraction of Pure Components Mass Spectra Using Sparse Componenet Analysis"; J. Mass. Spectromet; vol. 44, Aug. 7, 2009; pp. 1378-1388.

Winter, et al.; "N-FINDR: An Algorithm for Fast Autonomous Spectral End-Member Determination in Hyperspectral Data"; Part of SPIE Conference on Imaging Spectrometry V; SPIE vol. 3753; Jul. 1999; pp. 266-275.

C. Chang et al., "Novel sparse component analysis approach to free radical EPR spectra decomposition," Journal of Magnetic Resonance 175, 242-255, 2005.

Y. Washizava, A. Cichocki, "On-Line k-plane clustering learning algorithm for sparse component analysis," in: Proceedings of ICASSP'06, Toulouse, France, pp. 681-684, 2006.

Takigawa, et al.; "Performance Analysis of Minimum l1-Norm Solutions for Underdetermined Source Separation"; IEEE Transactions on Signal Processing, col. 52, No. 3; Mar. 2004; p. 582-591.

K. Stadlthanner, et al. "Separation of water artifacts in 2D NOESY protein spectra using congruent matrix pencil," Neurocomputing 69, 497-522, 2006.

J.A. Tropp, A.C. Gilbert, "Signal Recovery From Random Measurements Via Orthogonal Matching Pursuit," IEEE Transactions on Information Theory, vol. 53,No. 12, 4655-4666, 2007.

P. Georgiev, F. Theis, and A. Cichocki, "Sparse Component Analysis and Blind Source Separation of Underdetermined Mixtures," IEEE Trans. on Neural Networks, vol. 16, No. 4, 992-996, 2005.

Y. Li, S. Amari, A. Cichocki, D.W.C. Ho, S. Xie, "Underdetermined Blind Source Separation Based on Sparse Representation," IEEE Trans. on Signal Processing, vol. 54, No. 2, 423-437, 2006.

P. Bofill and M. Zibulevsky, "Underdetermined blind source separation using sparse representations"; Signal Processing 81, 2353-2362, 2001.

Kim, et al.; "Underdetermined Blind Source Separation Based on Subspace Representation"; IEEE Transactions on Signal Processing; vol. 57, No. 7; Jul. 2009; pp. 2604-2612.

J. M. P. Nascimento, and J. M. Bioucas Dias, "Vertex Component Analysis: A Fast Algorithm to Unmix Hyperspecral Data," IEEE Trans. Geoscience and Remote Sensing, vol. 43 (2005) 898-909.

* cited by examiner

*FIG. 2A*
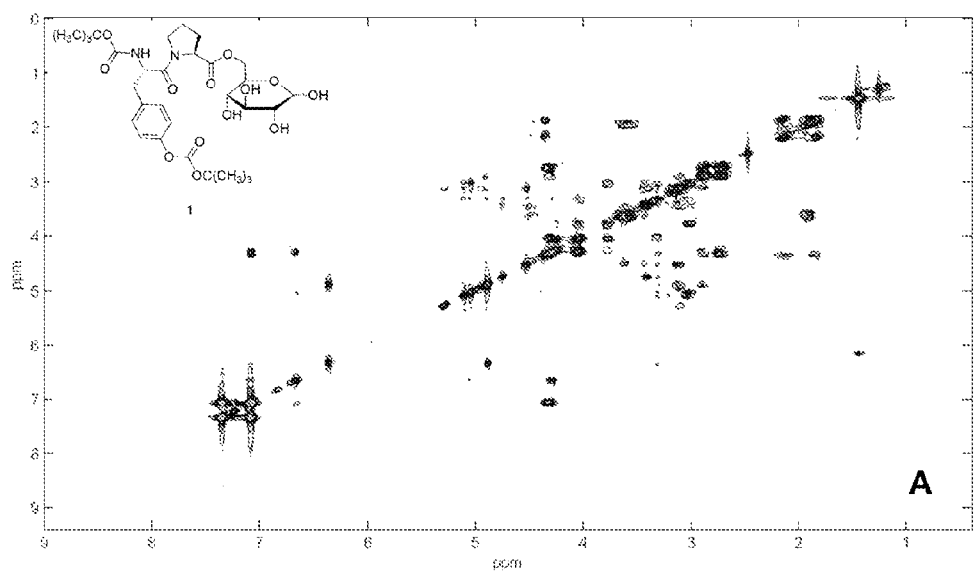
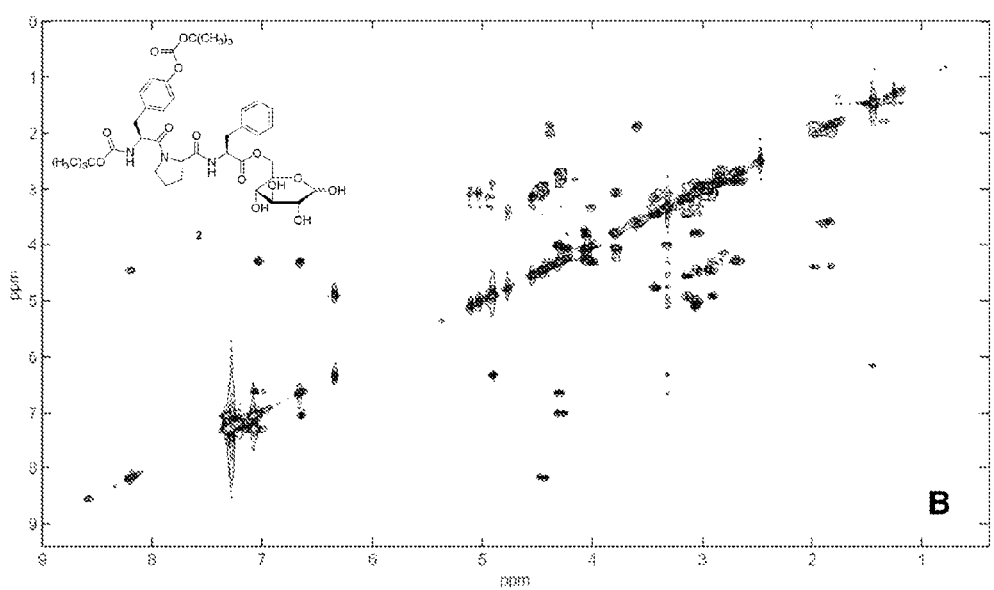
*FIG. 2B*

FIG. 2C
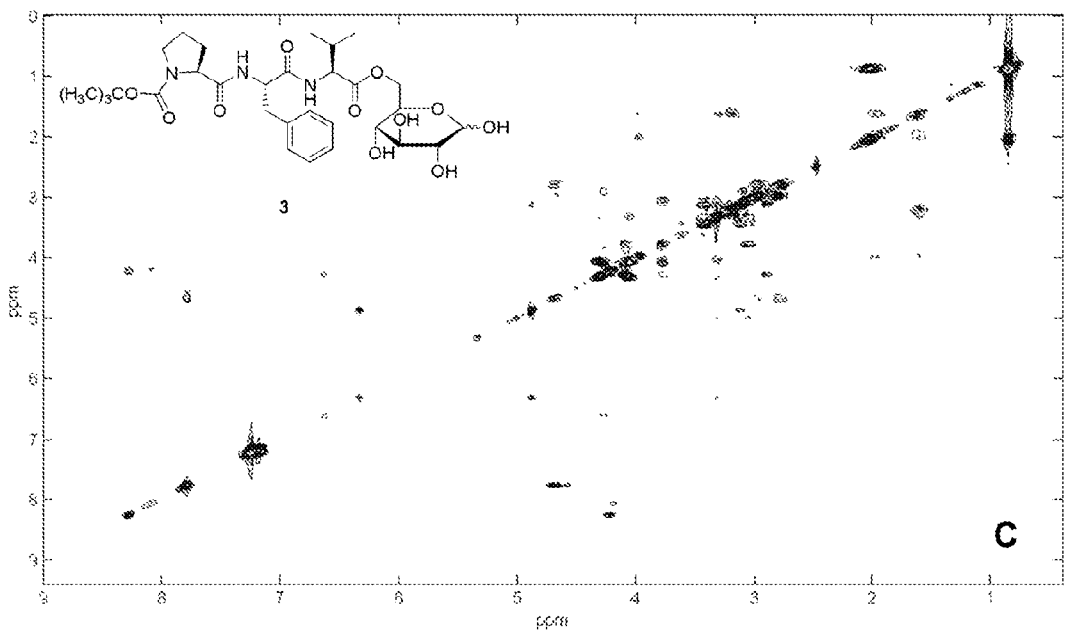
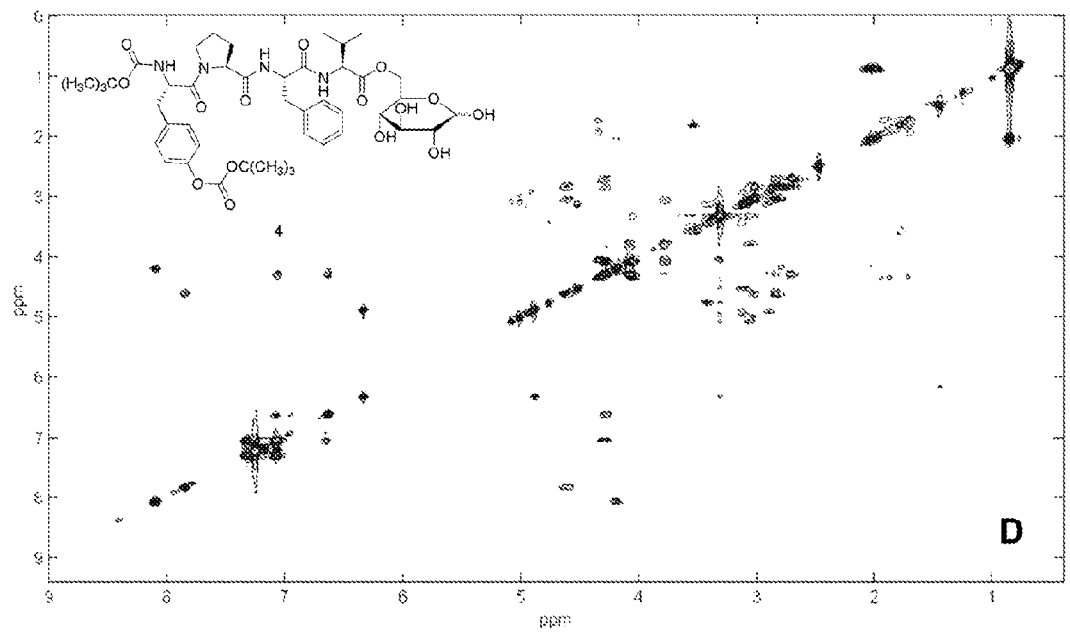
FIG. 2D

FIG. 2E
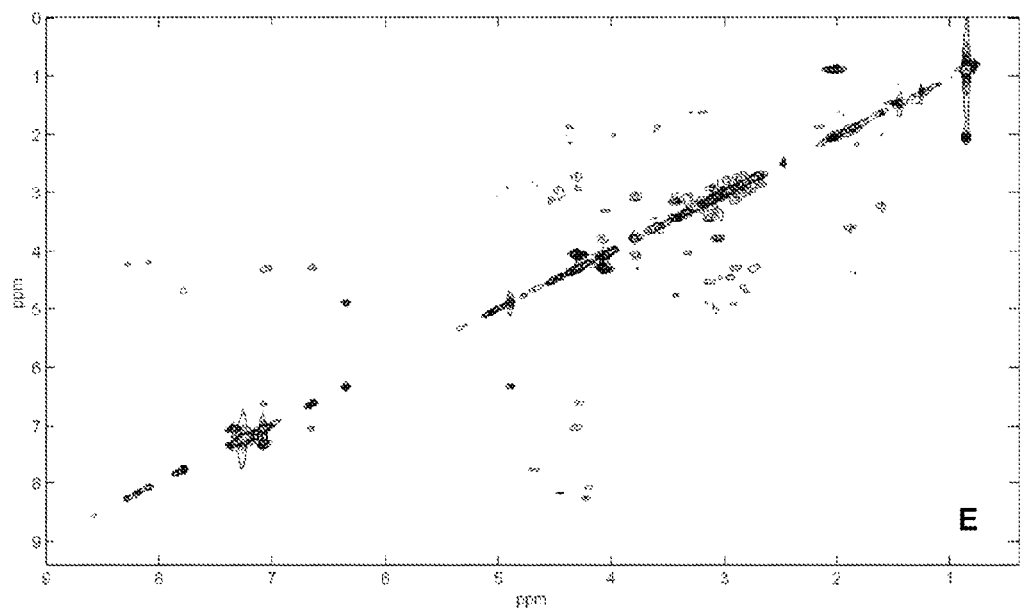
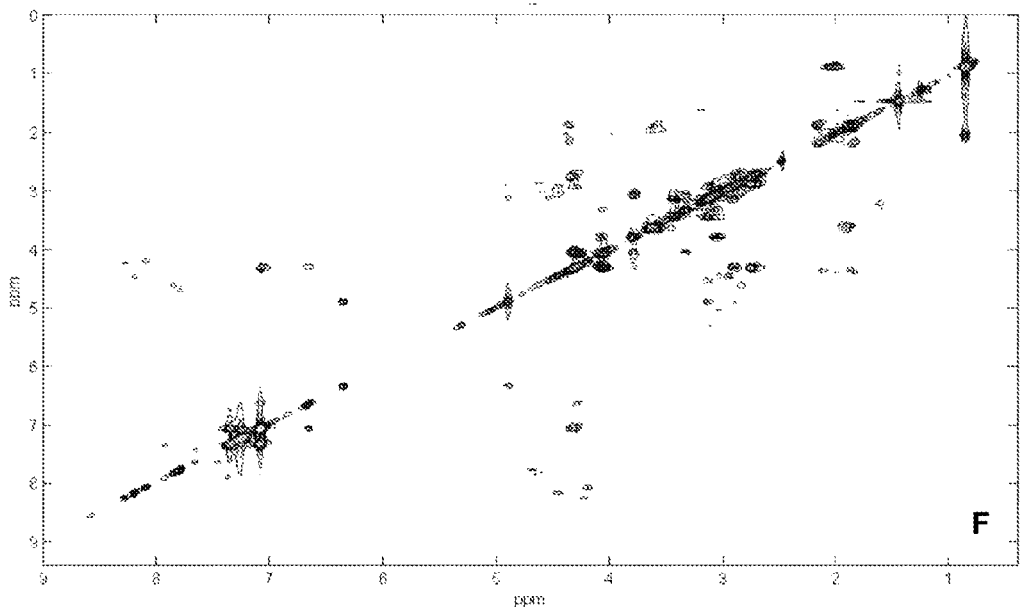
FIG. 2F

*FIG. 2H*
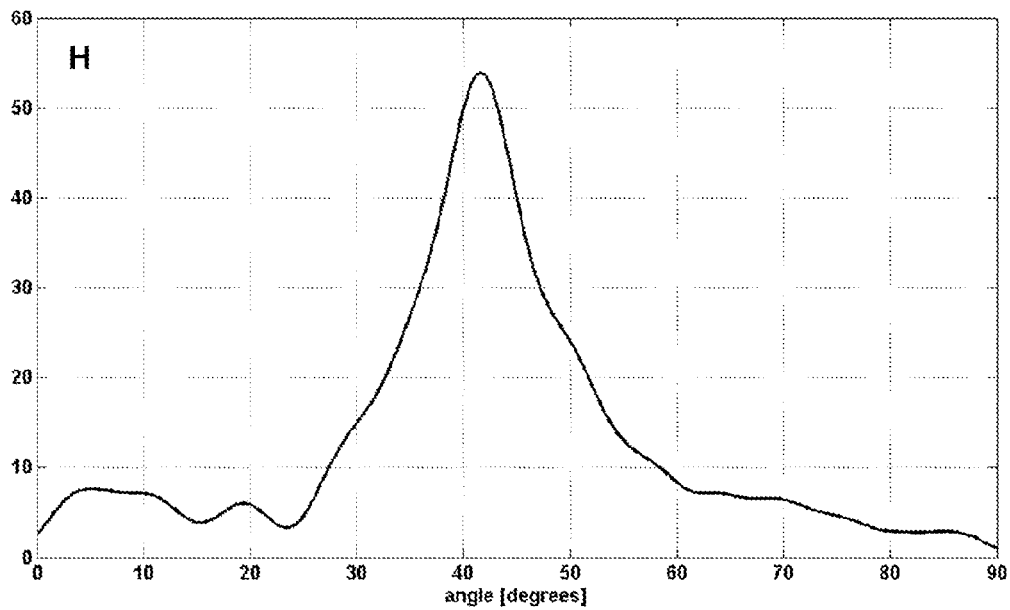
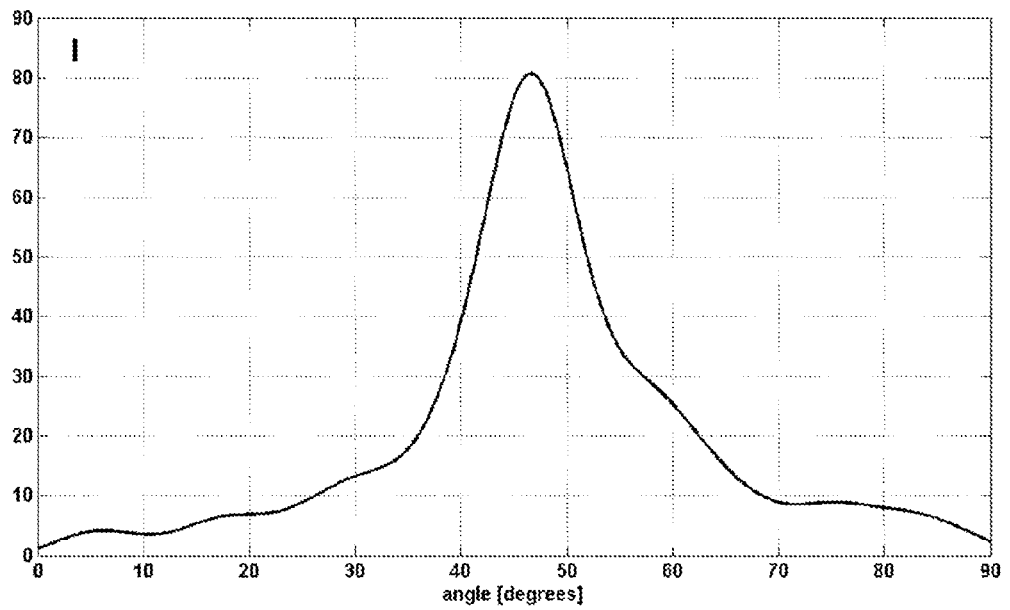
*FIG. 2I*

*FIG. 2K*
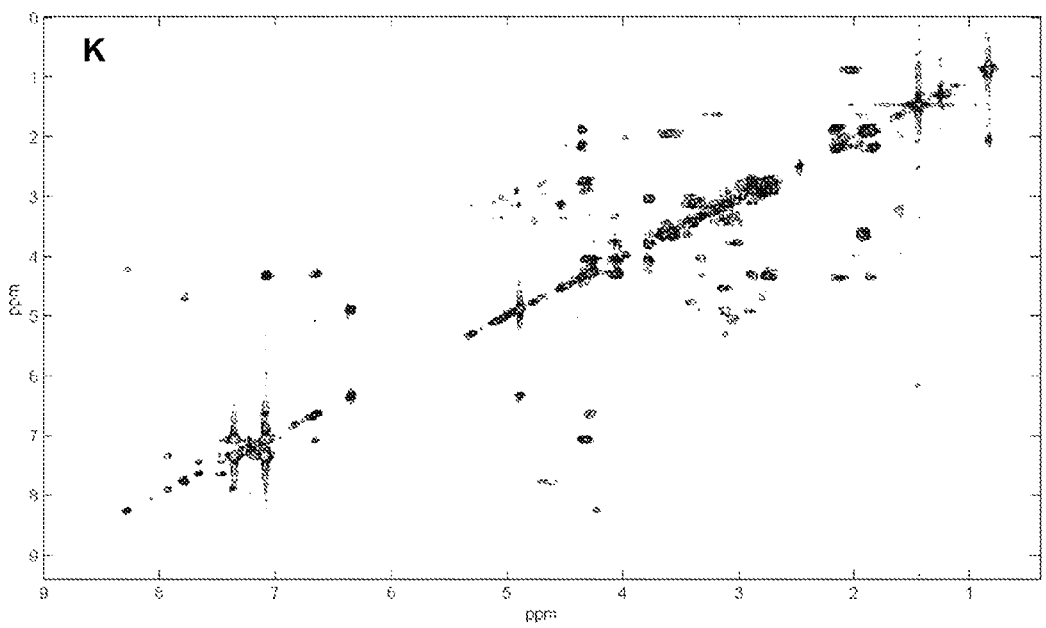
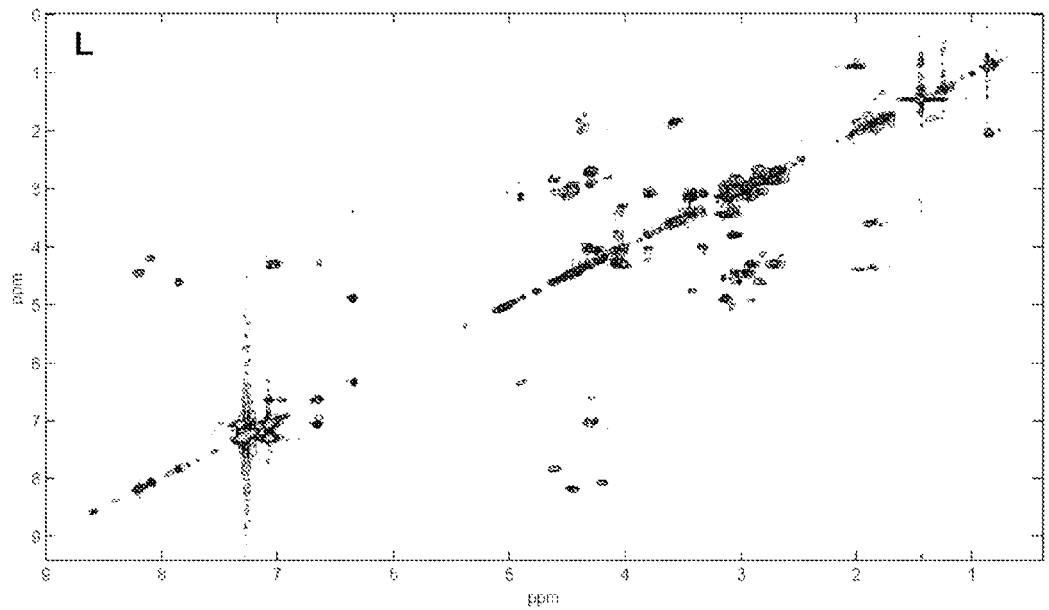
*FIG. 2L*

FIG. 2M
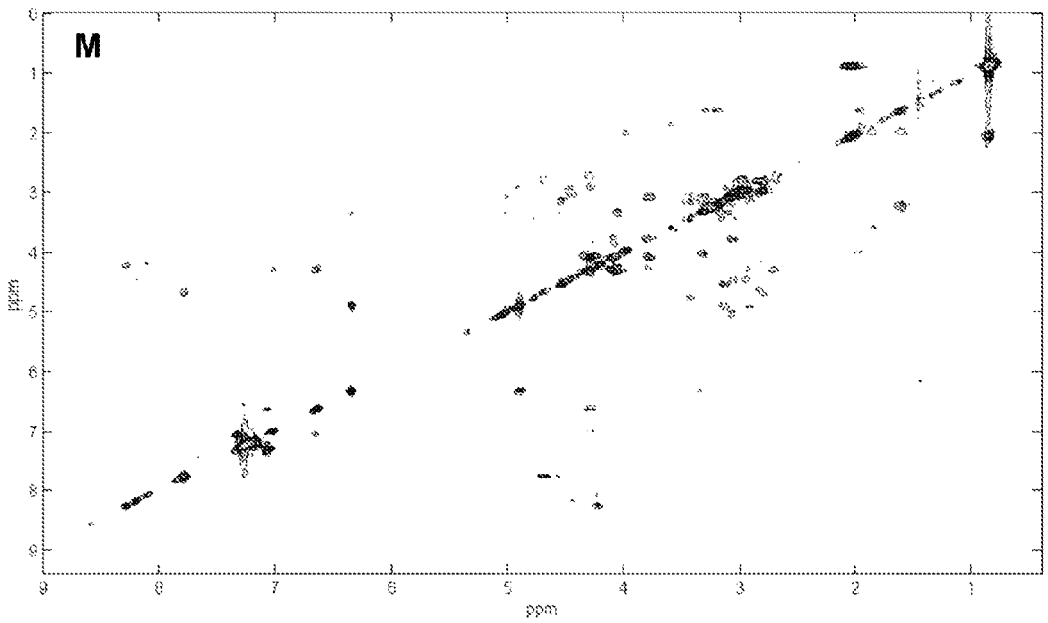
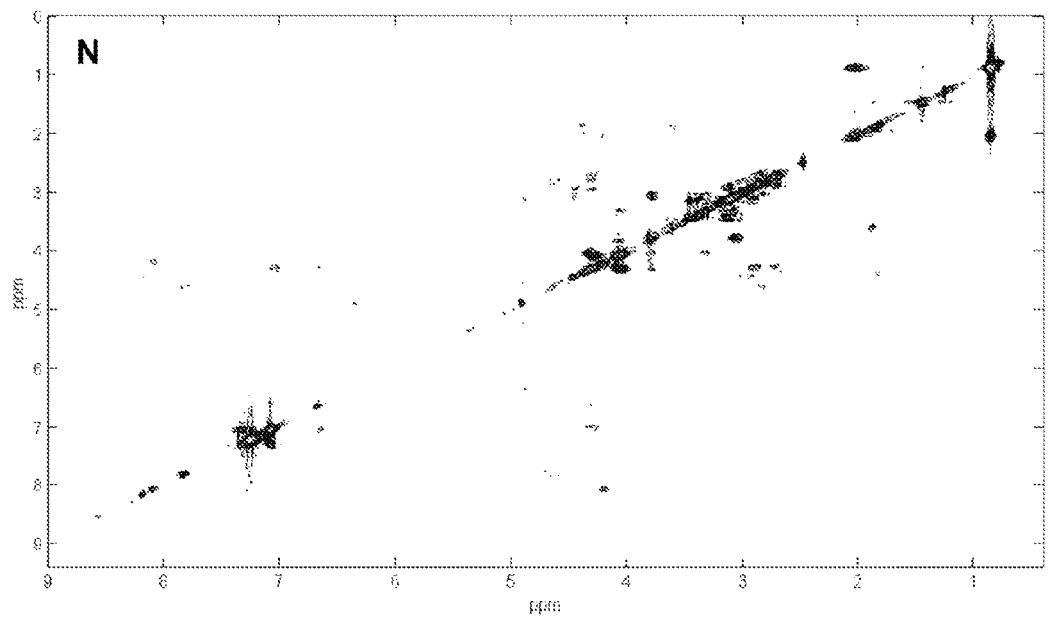
FIG. 2N

FIG. 2O
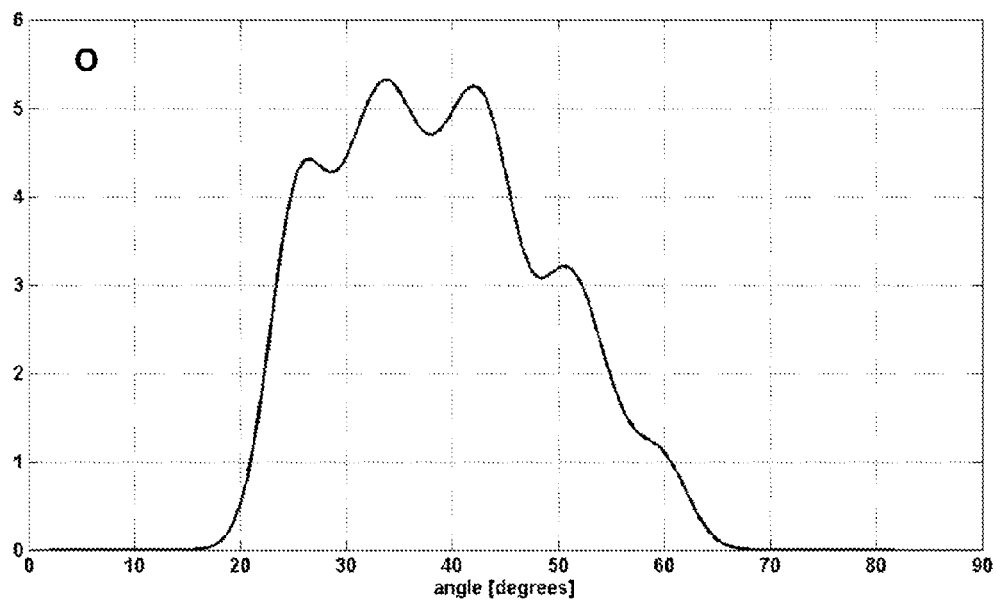
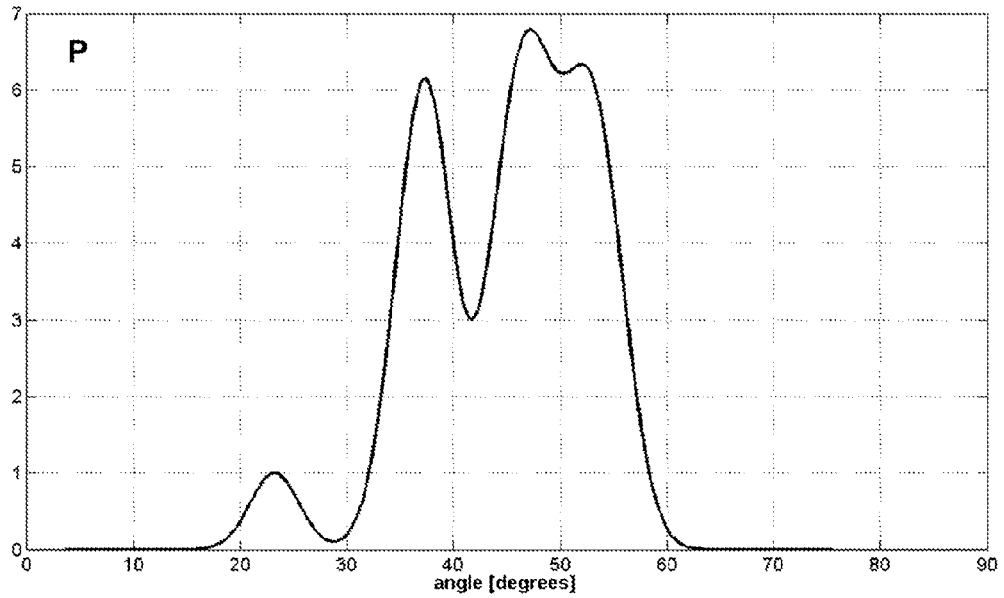
FIG. 2P

*FIG. 2R*
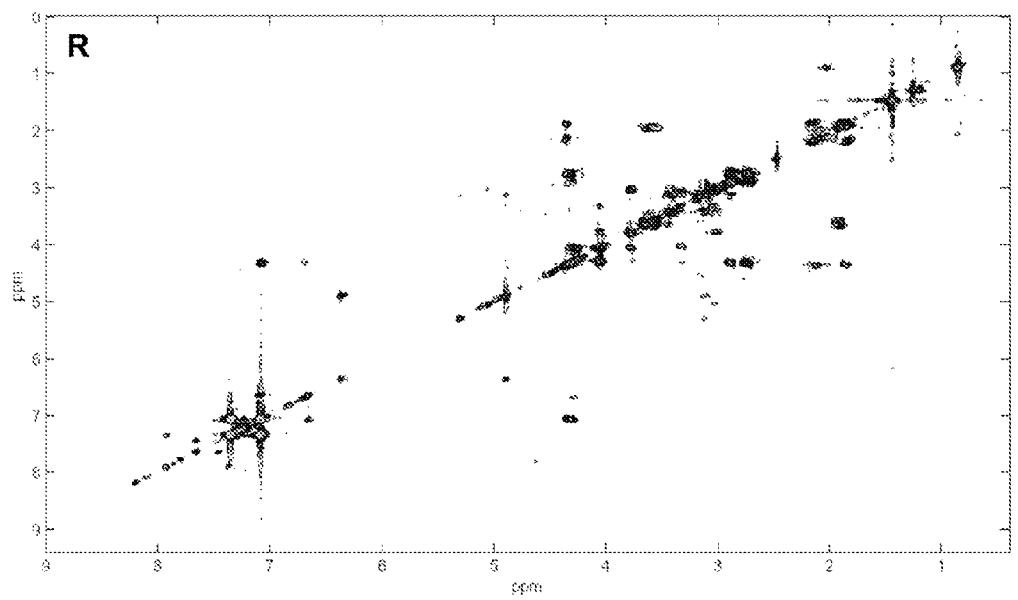
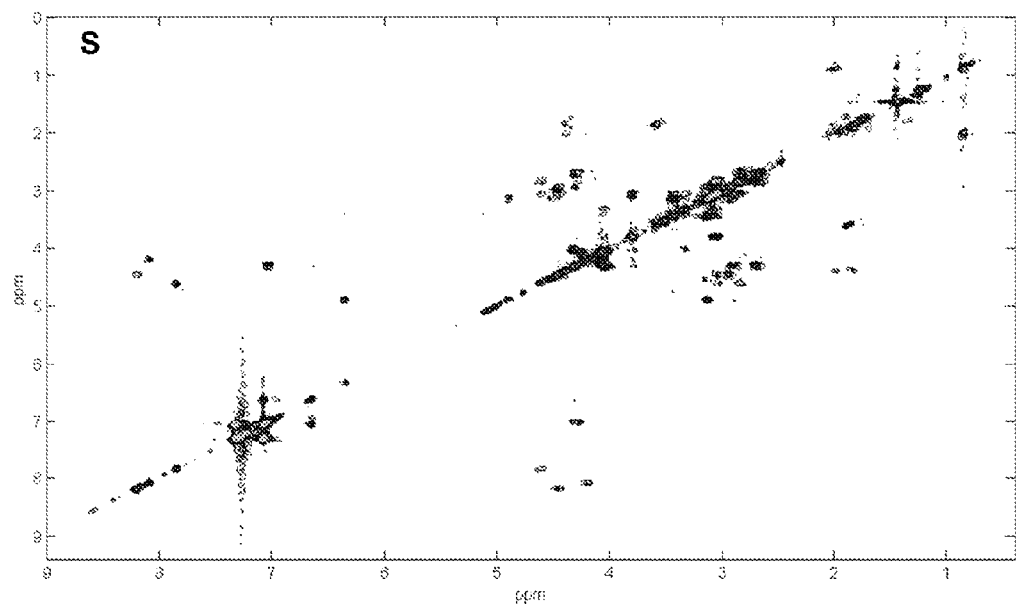
*FIG. 2S*

*FIG. 2T*
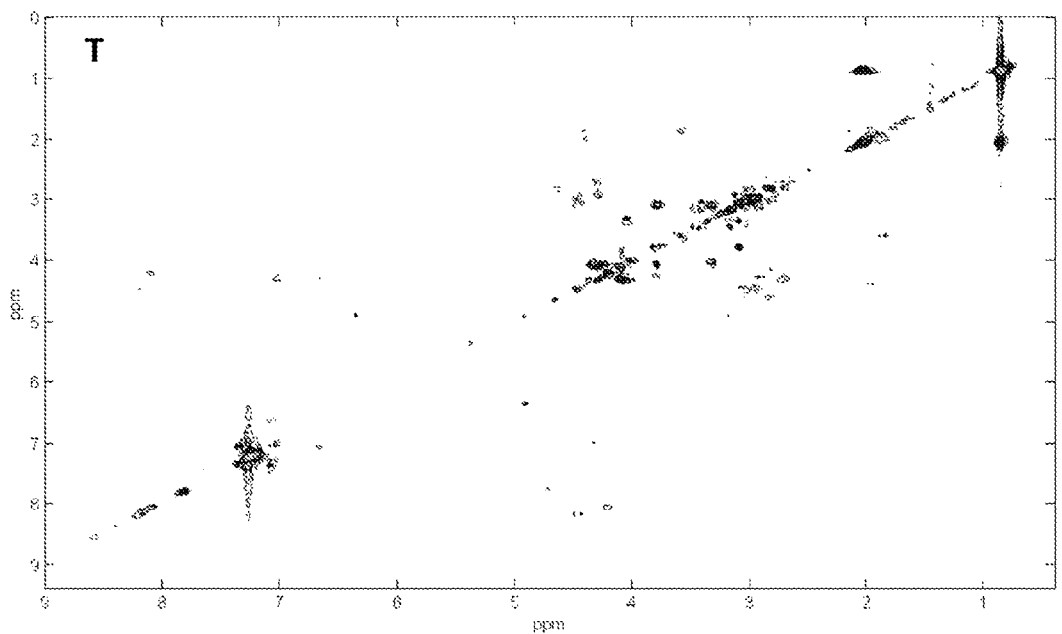
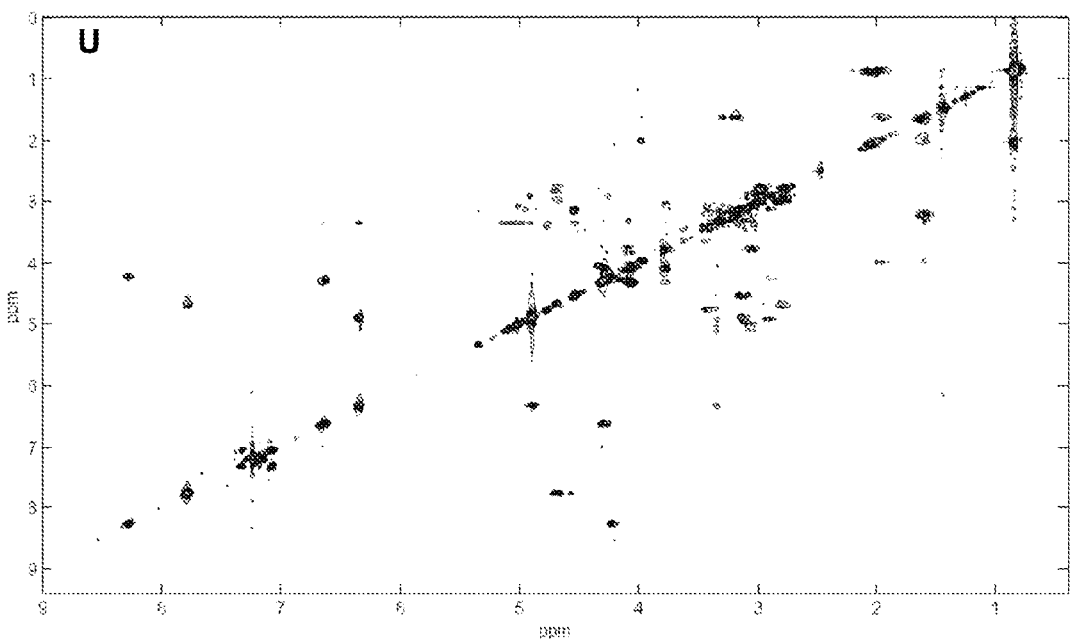
*FIG. 2U*

|  | $PC_1$ | $PC_2$ | $PC_3$ | $PC_4$ |
|---|---|---|---|---|
| $PC_1$ | 1 | 0.5509 | 0.1394 | 0.3730 |
| $PC_2$ | 0.5509 | 1 | 0.3051 | 0.5120 |
| $PC_3$ | 0.1394 | 0.3051 | 1 | 0.7965 |
| $PC_4$ | 0.3730 | 0.5120 | 0.7965 | 1 |

*FIG. 2V*

|  | $PC_1$ | $PC_2$ | $PC_3$ | $PC_4$ |
|---|---|---|---|---|
| $P\hat{C}_1$ | 0.8931 | 0.4753 | 0.2638 | 0.4132 |
| $P\hat{C}_2$ | 0.5634 | 0.8579 | 0.2795 | 0.5366 |
| $P\hat{C}_3$ | 0.1945 | 0.5048 | 0.8990 | 0.7953 |
| $P\hat{C}_4$ | 0.4386 | 0.6124 | 0.8060 | 0.8381 |

*FIG. 2W*

|  | $PC_1$ | $PC_2$ | $PC_3$ | $PC_4$ |
|---|---|---|---|---|
| $P\hat{C}_1$ | 0.8924 | 0.6009 | 0.2754 | 0.4602 |
| $P\hat{C}_2$ | 0.5482 | 0.8469 | 0.3107 | 0.5695 |
| $P\hat{C}_3$ | 0.0931 | 0.4101 | 0.8432 | 0.7249 |
| $P\hat{C}_4$ | 0.3108 | 0.3411 | 0.8236 | 0.7331 |

*FIG. 3B*
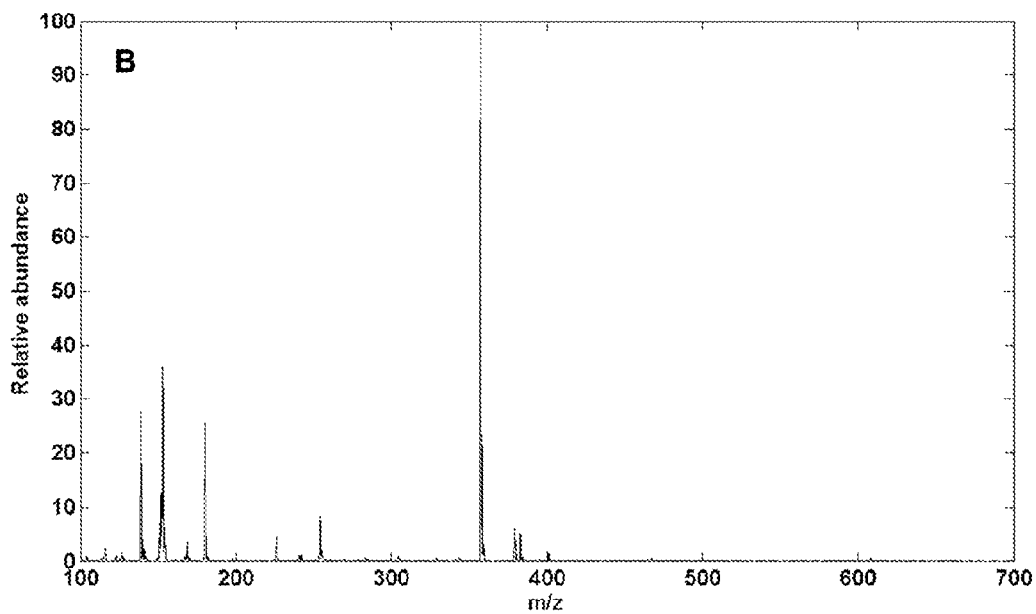
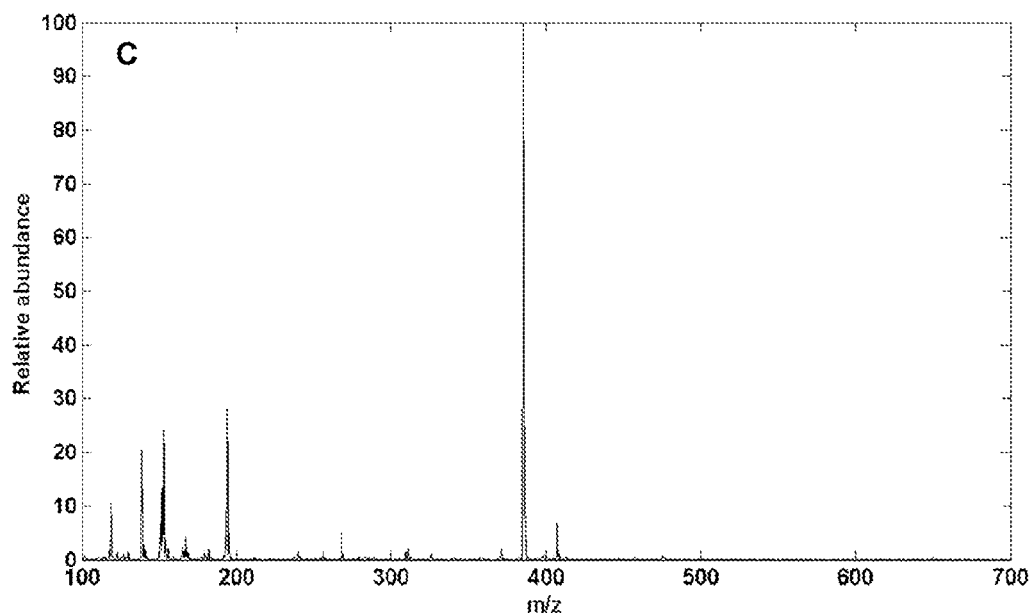
*FIG. 3C*

FIG. 3D
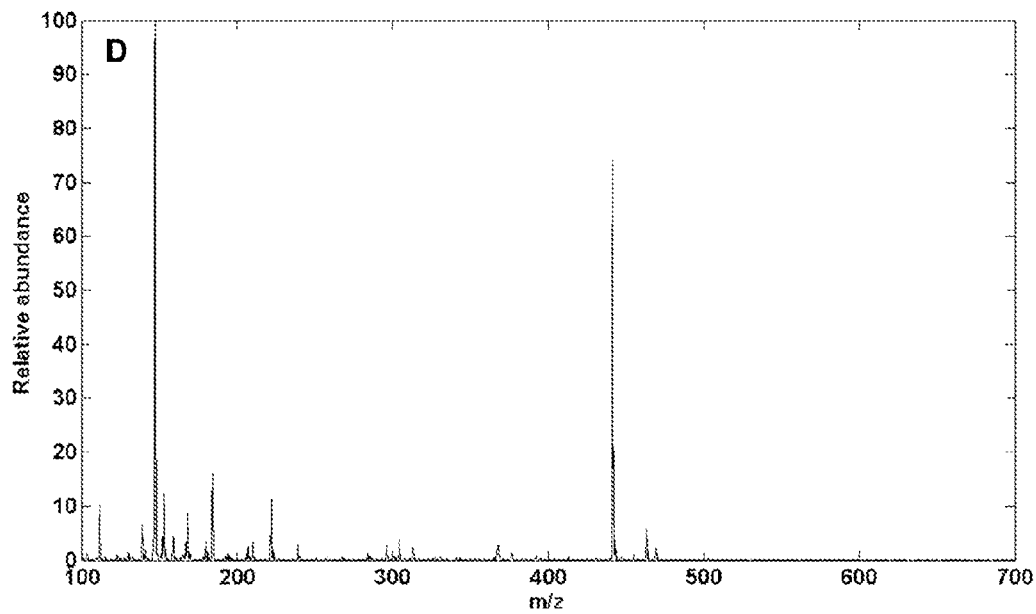
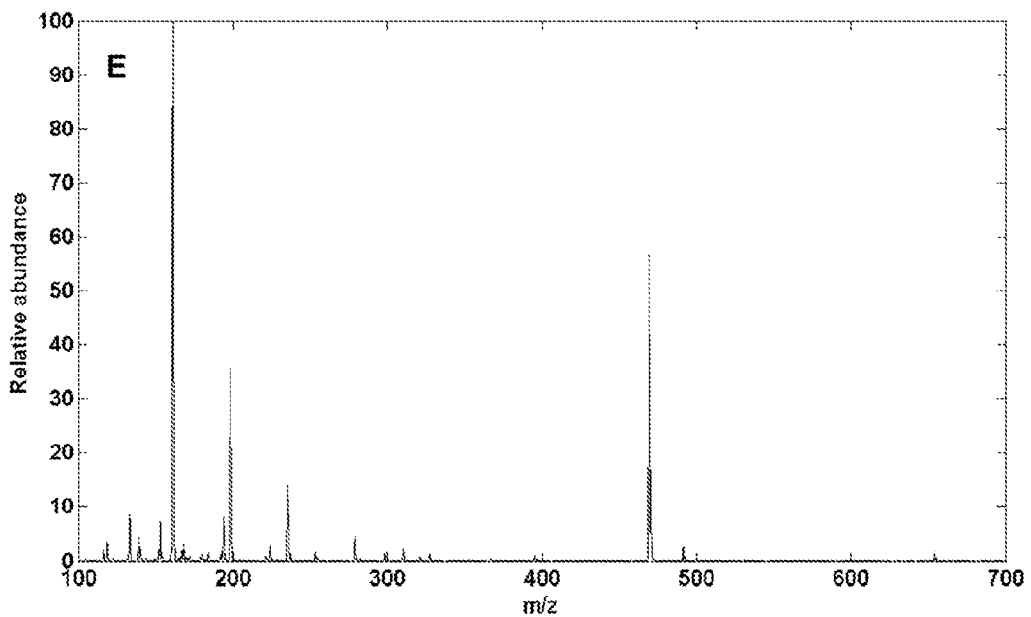
FIG. 3E

FIG. 3G
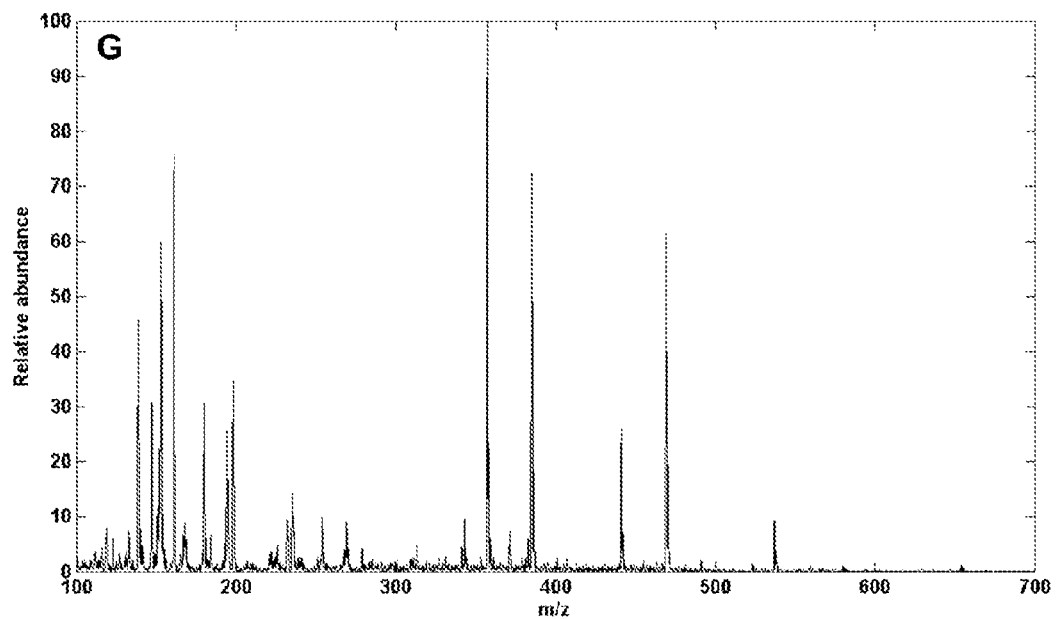
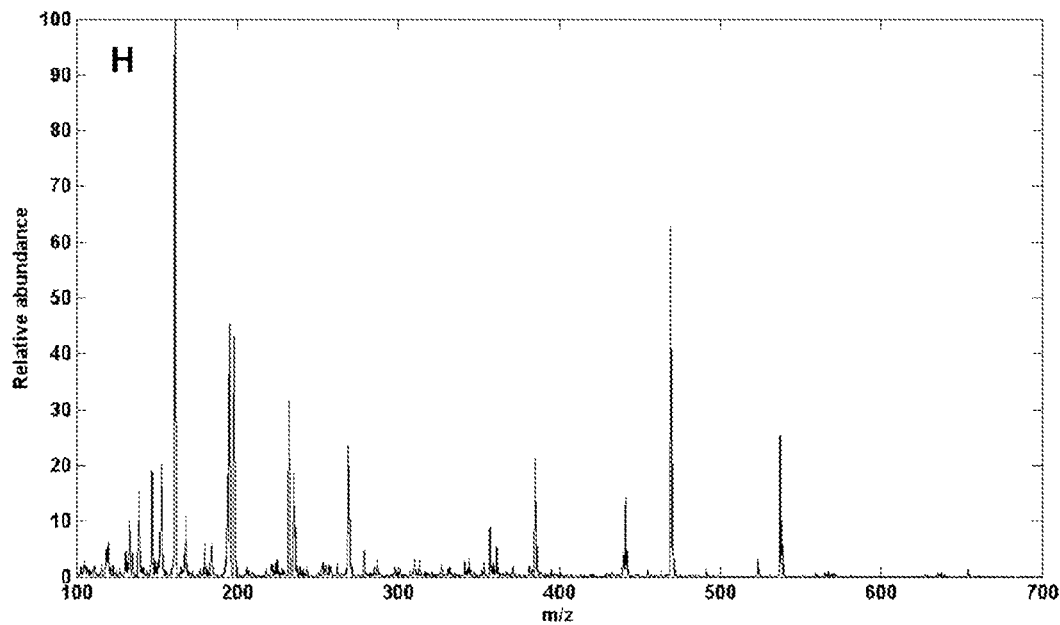
FIG. 3H

*FIG. 3J*
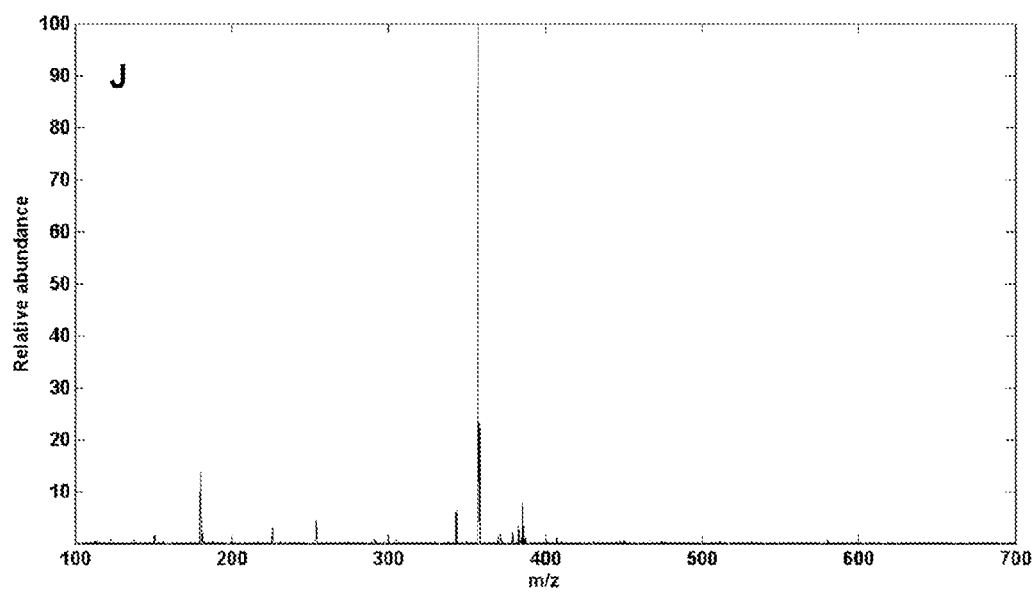
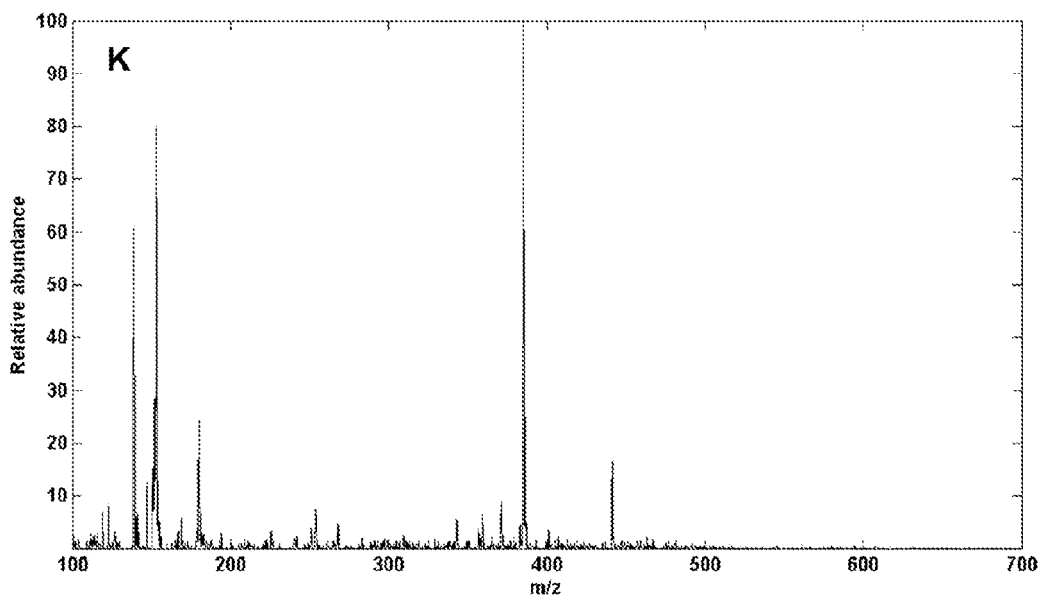
*FIG. 3K*

FIG. 3L
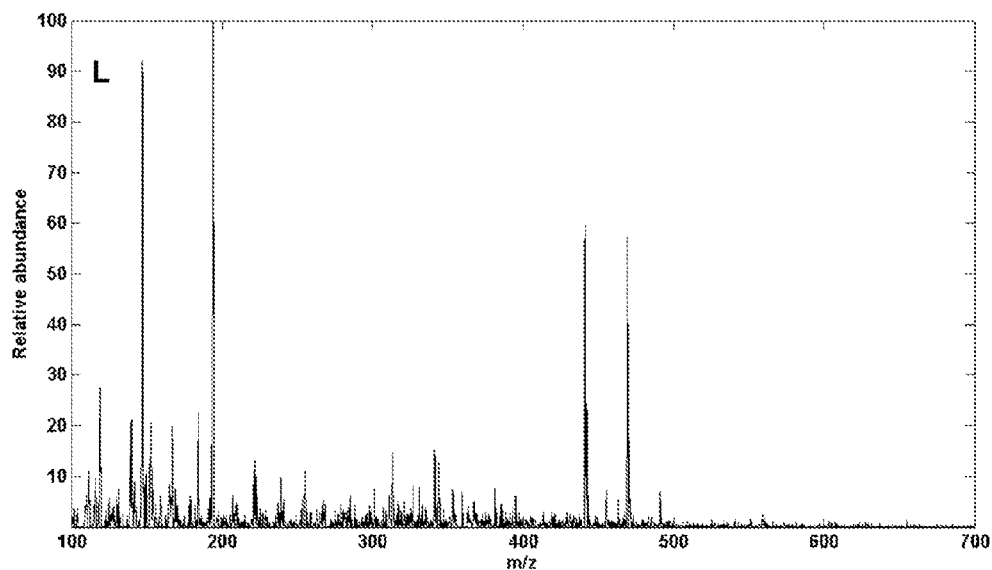
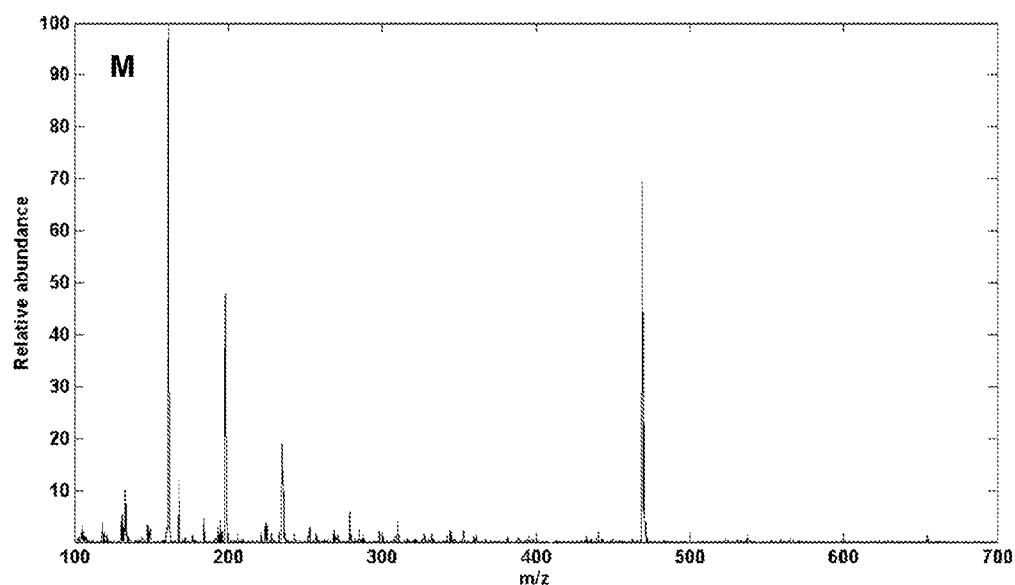
FIG. 3M

|  | $PC_1$ | $PC_2$ | $PC_3$ | $PC_4$ | $PC_5$ |
|---|---|---|---|---|---|
| $PC_1$ | 1 | 0.1268 | 0.0456 | 0.0266 | 0.0075 |
| $PC_2$ | 0.1268 | 1 | 0.0321 | 0.0332 | 0.0379 |
| $PC_3$ | 0.0456 | 0.0321 | 1 | 0.0134 | 0.0030 |
| $PC_4$ | 0.0265 | 0.0332 | 0.0134 | 1 | 0.0029 |
| $PC_5$ | 0.0075 | 0.0379 | 0.0030 | 0.0029 | 1 |

|  | $PC_1$ | $PC_2$ | $PC_3$ | $PC_4$ | $PC_5$ |
|---|---|---|---|---|---|
| $P\hat{C}_1$ | 0.8864 | 0.0455 | 0.0025 | 0.0048 | 0.0062 |
| $P\hat{C}_2$ | 0.3436 | 0.8031 | 0.1824 | 0.0393 | 0.0061 |
| $P\hat{C}_3$ | 0.0499 | 0.1888 | 0.6854 | 0.1838 | 0.0013 |
| $P\hat{C}_4$ | 0.0080 | 0.0065 | 0.0098 | 0.9713 | 0.0013 |
| $P\hat{C}_5$ | 0.0122 | 0.0157 | 0.0075 | 0.3168 | 0.9006 |

METHOD OF AND SYSTEM FOR BLIND EXTRACTION OF MORE PURE COMPONENTS THAN MIXTURES IN 1D AND 2D NMR SPECTROSCOPY AND MASS SPECTROMETRY COMBINING SPARSE COMPONENT ANALYSIS AND SINGLE COMPONENT POINTS

CROSS-REFERENCE TO RELATED APPLICATIONS

The present application is a continuation of pending International Patent Application PCT/HR2009/000028 filed on Sep. 10, 2009 which designates the United States, and the content of which is incorporated herein by reference.

FIELD OF THE INVENTION

The present invention relates to a computer-implemented method for data processing for the purpose of blind extraction of more pure components than mixtures recorded in the fields of 1D and 2D NMR spectroscopy and mass spectrometry. Specifically, the invention relates to the use of the sparse component analysis (SCA) and the detection of single component points. Extracted pure components are used for identification of compounds in chemical synthesis, food quality inspection or pollution inspection i.e. environment protection, identification and characterization of compounds obtained from natural sources (microorganisms, plants and animals), or in instrumental diagnostics—determination and identification of metabolites and biomarkers present in biological fluids (urine, blood plasma, cerebrospinal fluid, saliva, amniotic fluid, bile, tears, etc.) or tissue extracts.

BACKGROUND OF THE INVENTION

In a number of applications it is of interest to extract pure compounds from the collections of their linear combinations also called mixtures. Quantification and identification of the components present in the mixture is a traditional problem in NMR, IR, UV, EPR and Raman spectroscopy, mass spectrometry, etc. Identification of the spectra of mixtures proceeds in majority of the cases by matching the mixture's spectra with a library of reference compounds. This approach is ineffective with the accuracy strongly dependent on the library's content of the pure component spectra. In addition to that, for a number of compounds isolated from natural sources or obtained in proteomics- and metabolomics-related studies there is no library of pure components available yet.

As opposed to the previous library-based approach it has been repeatedly demonstrated over the last ten years the possibility to separate mixture's spectra into pure component spectra employing the methodology known as blind source separation (BSS) that uses only the measurements of the mixture's spectra. Two widely spread methods in this domain are independent component analysis (ICA) and nonnegative matrix factorization (NMF). ICA belongs to group of statistical methods for solving blind linear inverse problems. Assumptions upon which the ICA algorithms are built are that unknown pure components are statistically independent and non-Gaussian, as well as that the number of linearly independent mixtures is greater than or equal to the number of pure components. NMF belongs to the group of algebraic methods for solving linear inverse problems. It also requires that the number of linearly independent mixtures is greater than or equal to the number of pure components as well as that pure components are nonnegative and sparse. Nonnegativity requirement and sparseness requirement are not satisfied simultaneously in a majority of spectroscopic applications. The general principle of blind extraction of pure components employing the BSS approach is schematically shown in FIG. 1 that will be discussed below.

One of the most known ICA algorithms is described in the U.S. Pat. No. 5,706,402 (B2), patent application WO 9617309 (A), as well as in the paper: A. J. Bell and T. J. Sejnowski. An information-maximization approach to blind separation and blind deconvolution. Neural Computation; vol. 7, pp. 1129-1159, 1995. Reference literature for the field of blind source separation and independent component analysis are: A. Hyvärinen, J. Karhunen, E. Oja. Independent Component Analysis, John Wiley, 2001; A. Cichocki, S. Amari. Adaptive Blind Signal and Image Processing, John Wiley, 2002.

We point out here that two assumptions made by standard BSS methods: (i) the number of linearly independent mixtures is greater or equal to the unknown number of pure components; (ii) the pure components are statistically independent, are not easily and always met in real world applications in spectroscopy and spectrometry. The first assumption implies that concentrations of the pure components in different mixtures are different. This is not always easy to meet in practice. Therefore a methodology for blind decomposition of pure components from as few mixtures as possible is of great practical importance. The second assumption implies a small level of overlapping between the pure components. This is known not to be the case in a number of occasions. Few examples include $^1$H NMR spectroscopy, EPR spectroscopy, UV and IR spectroscopy, but also homo- and heteronuclear 2D NMR spectroscopy of complex chemical compounds and biomolecules such as proteins, enzymes, glycoproteins, nucleic acids, etc.

As described below in paragraphs, [0009]-[0014], BSS methods, mostly ICA, are used to extract pure components from the plurality of the spectroscopic or spectrometric signals. In a number of occasions it is emphasized that statistical independence among the pure components is not a correct assumption in spectroscopy and spectrometry. What is in common to the BSS methods to be elaborated is that number of linearly independent mixtures is required to be greater than or equal to the unknown number of pure components.

Review of application of ICA in signal processing for analytical chemistry is given in: G. Wang, Q. Ding, Z. Hou, "Independent component analysis and its applications in signal processing for analytical chemistry," Trends in Analytical Chemistry, vol. 27, No. 4, 368-376, 2008.

The BSS based approach to blind decomposition of the NMR spectra is presented in: D. Nuzillard, S. Bourg and J.-M. Nuzillard, "Model-Free Analysis of Mixtures by NMR Using Blind Source Separation," Journal of Magnetic Resonance 133, 358-363, 1998; D. Nuzillard, J.-M. Nuzzilard, "Application of Blind Source Separation to 1D and 2D Nuclear Magnetic Resonance Spectroscopy," IEEE Signal Processing Letters, vol. 5, No. 8, 209-211, 1998; K. Stadlthanner, et al. "Separation of water artifacts in 2D NOESY protein spectra using congruent matrix pencil," Neurocomputing 69, 497-522, 2006. Employed BSS methodologies assumes: (i) that the number of linearly independent mixtures is greater or equal to the unknown number of pure components; (ii) the pure components are statistically independent. Statistical independence assumption has been relaxed in: W. Naanaa, J.-M. Nuzzilard, "Blind source separation of positive and partially correlated data," Signal Processing 85, 1711-1722, 2005. However it is still required that the number of linearly independent mixtures is greater than or equal to the unknown number of pure components.

The use of ICA and mean filed ICA in blind decomposition of the signals in gas chromatography-mass spectrometry (GC-MS) is elaborated respectively in: X. Shao, G. Wang, S. Wang, Q. Su, "Extraction of Mass-Spectra and Chromatographic Profiles from Overlapping GC/MS Signal with Background," Analytical Chemistry 76, 5143-5148, 2004; G. Wang, W. Cai, X. Shao, "A primary study on resolution of overlapping GC-MS signal using mean-field approach independent component analysis," Chemometrics and Intelligent Laboratory Systems 82, 137-144, 2006. The later reference elaborates a method for blind decomposition of statistically dependent spectrometric signals. However, it is still required that the number of linearly independent mixtures is greater than or equal to the unknown number of pure components.

Blind decomposition of the EPR mixture spectra is introduced in: J. Y. Ren, et al., "Free radical EPR spectroscopy analysis using blind source separation," Journal of Magnetic Resonance 166, 82-91, 2004. The standard ICA algorithm (FastICA) has been applied for blind separation of the EPR spectra. In the following reference it has been however realized that pure components in EPR spectroscopy are not statistically independent as well as that EPR spectra are sparse: C. Chang et al., "Novel sparse component analysis approach to free radical EPR spectra decomposition," Journal of Magnetic Resonance 175, 242-255, 2005. Sparseness has been used to cope with statistical dependence problem among the pure components and novel contrast function that measures sparseness of the EPR spectra is proposed in this reference. However, the number of mixtures is still required to be greater than or equal to the number of pure components.

The use of latent variable analysis, specifically non-negative ICA, for blind decomposition of Raman spectra is elaborated in: V. A. Shashilov et al., "Latent variable analysis of Raman spectra for structural characterization of proteins," Journal of Quantitative Spectroscopy & Radiative Transfer 102, 46-61, 2006. Non-negative ICA took into account non-negativity of the variables in the assumed linear mixture model but still the number of mixtures was required to be greater or equal to the unknown number of pure components.

ICA has been applied to IR spectral data analysis in: J. Chen, X. Z. Wang, "A New Approach to Near-Infrared Spectral Data Analysis Using Independent Component Analysis," J. Chem. Inf. Comput. Sci. 41, 992-1001, 2001. It is however known that pure components in the spectral domain are statistically dependent: J. M. P. Nascimento, J. M. Bioucas Dias, "Does Independent Component Analysis Play a Role in Unmixing Hyperspectral Data?," IEEE Transactions on Geoscience and Remote Sensing 43, 175-187, 2005. Since statistical independence among the pure components is the obligated condition for the ICA to work, the ICA approach to IR spectra decomposition has limited accuracy. In addition to that, the number of spectral measurements (mixtures) is still required to be greater than or equal to the unknown number of pure components.

Paragraphs, [0015]-[0033], discuss patents and patent applications related to BSS concepts that fall into two categories: those that are claimed for applications in spectroscopy and spectrometry and those that solve the BSS problem using two mixtures only. The methods of the first category still require the number of mixtures to be greater than or equal to the number of pure components. The methods of the second category are based on assumptions made on the structure of the source signals that are specific to application domain (voice signals) what disables their applicability in the fields of spectroscopy and spectrometry.

The US patent application 20040111220 "Methods of decomposing complex data" presents a method for blind decomposition of the mixture matrix that is a statistically based data mining technique. It claims applications in spectroscopy, spectrometry, genomics, proteomics, etc. It however requires the number of mixtures to be greater than the number of the unknown components. This is evident at the first stage of the algorithm where principal component analysis (PCA) is used to remove outlier and noisy components from data. This is done by inspecting eigenvalues of the data covariance matrix wherein the overall number of eigenvalues equals the number of mixtures. Thus, this method can not work when number of mixtures is smaller than number of pure components.

The US patent application 20070252597 "Magnetic resonance spectroscopy with sparse spectral sampling and interleaved dynamic shimming" is related to 4D (three spatial and one spectral dimension) magnetic resonance spectroscopy and is characterized by sparse sampling across spectral dimension. Here sparseness of the components is a consequence of the multidimensionality of the data, i.e. sensing device.

The patent application WO2007138544 "Coding and decoding: seismic data modeling, acquisition and processing" presents a method for blind decomposition of seismic data. In said application uBSS problem is converted to determined problem generating new equations by means of higher order statistics. This is however specific for the seismic data processing domain only.

The patent application CN1932849 "Initial method for image independent component analysis" exploits sparseness of the data in wavelet domain in order to obtain more accurate estimate of the mixing matrix. The estimate of the mixing matrix is then used as the initial condition for standard ICA algorithms. Thus, said application is essentially related to even- or over-determined BSS problems that require the number of mixtures to be greater than or equal to the number of pure components.

The patent application WO2007112597 "Blind extraction of pure component mass spectra from overlapping mass spectrometric peaks" is related to blind extraction of the pure components from recorded multicomponent gas chromatography-mass spectrometric signals (mixtures) by means of entropy minimization approach. It also estimates the unknown number of the pure components based on the ranking of the singular values of the sample data covariance matrix and discarding the small singular values that are attributed to chemical noise. Thus, said application ultimately requires the number of mixtures to be greater than the unknown number of pure components.

The U.S. Pat. No. 7,295,972 "Method and apparatus for blind source separation using two sensors" is related to a novel algorithm for blind extraction of multiple source signals from two mixtures only. The method transforms mixtures into frequency domain and employs the strategy that is similar to famous DUET algorithm (Blind Separation of Disjoint Orthogonal Signals: Demixing n sources from 2 mixtures, by A. Jourjine, S. Rickard, and O. Yilmaz, in Proc. Int. Conf. on Acoust., Speech, Signal Processing, 2000, vol. 5, pp. 2985-2988) where specific assumption on disjoint orthogonality is made. The requirement of this assumption is that only one source signals exist at the point in the time-frequency plane. This assumption is very restrictive and seems to be approximately true for the voice signals only. Thus said method is not applicable to the field of spectroscopy and spectrometry where pure components exist simultaneously in time and frequency (few examples include $^1$H NMR and EPR signals).

The U.S. Pat. No. 7,280,943 "Systems and methods for separating multiple sources using directional filtering," is related to semi-blind extraction of multiple source signals from one or more received signals. The method is semi-blind because it assumes that each source signals can be represented by a set of known basis functions and directional filters that incorporate prior knowledge on the type of the sources and their directions of arrival. The last assumption surely does not hold when spectroscopy and spectrometry are considered as application domains. This is because the signals arising in spectroscopy and spectrometry do not have spatial structure, i.e. there are no distinct spatial locations to which the pure component signals can be associated and there are no distinct spatial locations of the receiving sensors (the multiple mixtures are acquired over different time slots or different wavelengths).

The U.S. Pat. No. 7,010,514 "Blind signal separation system and method, blind signal separation program and recording medium thereof" presents a solution of the BSS problems, including uBSS problem, using probabilistic approach known as maximum likelihood (M. S. Lewicki et. al., "Learning Overcomplete Representations," Neural Computation, vol. 12, pp. 337-365, 2000.). It is assumed in the patent that the number of sources (also called pure components) is known. This is a first significant limitation of said patent. Probabilistic maximum likelihood approach implies that prior distribution of the unknown pure components is known in order to obtain the learning equation for the unknown mixing matrix. Because related uBSS problem can be solved only if sources have proper degree of sparseness this implies that problem must be transformed into the basis with enough degree of sparseness. Then, in order to obtain mathematically tractable learning rule for the mixing matrix, the Laplacian distribution is assumed for the prior distribution of the sources in the given basis. This is a second significant limitation of said patent. In practice we can not dictate distribution of the sources in the chosen basis because the number of available bases is limited and most frequently used basis, such as Fourier or wavelet basis, do not represent all types of signals with the same degree of sparseness. Therefore assumed Laplacian distribution of the sources will in reality deviate from the true distribution and this will be the source of errors in estimation of the mixing matrix.

The U.S. Pat. No. 6,944,579 "Online blind source separation," aims to extract multiple source signals from two mixtures only. The method transforms mixtures into time-frequency domain and employs the strategy of the algorithm published in: Blind Separation of Disjoint Orthogonal Signals: Demixing n sources from 2 mixtures, by A. Jourjine, S. Rickard, and O. Yilmaz, in Proc. Int. Conf. on Acoust., Speech, Signal Processing, 2000, vol. 5, pp. 2985-2988. The specific request of patented algorithm is that source signals are disjointly orthogonal in time-frequency plane. It is empirically known that this assumption is fulfilled for the voice signals. However, there is no rational to believe that it will be fulfilled for arbitrary type of signals such as for example those that arise in the fields of spectroscopy or spectrometry. The reason is that pure components residing in the spectroscopic mixture signals are active simultaneously in time and frequency. Hence, said method is not applicable to the fields of spectroscopy or spectrometry.

The U.S. Pat. No. 6,577,966 "Optimal ratio estimator for multisensor system," aims to extract multiple source signals from two mixtures only. Separation method based on optimal ratio estimation is possible provided that source signals do not overlap in time-frequency domain. As already commented this assumption approximately holds for the voice-type of signals and the purpose of said method is separation of multiple voice signals from two-microphone recordings. As already discussed in the previous paragraph it is not realistic to expect for arbitrary type of signals, such as those arising for example in the fields of spectroscopy of spectrometry, not to overlap in time-frequency plane. The reason is that pure components residing in the spectroscopic mixture signals are active simultaneously in time and frequency. Hence, said method is not applicable to the fields of spectroscopy or spectrometry.

The US Patent Application 20070257840 "Enhancement Techniques for Blind Source Separation," is related to improving performance of the BSS algorithms for separation of audio signals from two microphone recordings. Decorrelation based pre- and post-filtering (least means square filtering) is applied to the first and second microphone signals for the enhancement purpose. The method assumes that a first microphone is in the proximity of a first source signal and a second microphone is in the proximity of a second source signal. In this sense the known method is very limited and can not be applied to the field of spectroscopy and spectrometry where mixtures are obtained over time or wavelength (there is no plurality of the physical sensors) and more than two sources (pure components) exist.

The US patent application 20060064299 "Device and method for analyzing an information signal," is related to extraction of multiple audio signals from single mixture. The method splits the mixture into plurality of component signals and finds information content of each component signal based on calculation of their features; wherein feature is defined so that it is correlated with two source signals in two different subspaces. The features are audio signal specific and that is what limits this patent application to separate audio signals only. Hence, the algorithm presented in cited patent application is not applicable to the type of signals that arise in the fields of spectroscopy and spectrometry.

The US patent application 20060058983 "Signal separation method, signal separation device, signal separation program and recording medium," presents a signal separation algorithm capable to separate multiple source signals from multiple mixtures wherein the number of sources can be greater than the number of mixtures. The algorithm relies on standard concept when dealing with uBSS problems: transforming mixtures into frequency domain, performing data clustering to estimate number of sources and performing frequency domain ICA at those frequencies where two or more sources are active. Thus, the algorithm in cited patent applications has the following deficiencies: (i) the number of sensors must be greater than two if more than two sources are active at the same frequency; (ii) in relation to comment (i) Fourier basis (frequency domain), that is used by the cited application, is not optimal for the type of signals that arise in spectroscopy.

The US patent application 20050032231 "Identifying component groups with independent component analysis," presents ICA based solution for blind decomposition of multivariate spectrometric data. The solution of the cited application has the following deficiencies: (i) since the blind decomposition problem is solved by ICA, the number of mixtures must be greater than or equal to the unknown number of pure components; (ii) since ICA is used to solve blind decomposition problem, pure component must be statistically independent what is known not to be generally true for pure components arising in spectrometry: G. Wang et. al., "A primary study on resolution of overlapping GC-MS signal using mean-field approach independent component analysis," Chemometrics and Intelligent Laboratory Systems 82, 137-144, 2006; W. Naanaa, J.-M. Nuzzilard, "Blind source separation of positive and partially correlated data," Signal Processing 85, 1711-1722, 2005. Hence, the algorithm presented in cited application can not separate more than two spectroscopic signals that are statistically dependent using two mixtures only.

The US patent application 20030088384 "Chemical substance classification apparatus, chemical substance classification method, and program" presents an ICA based solution for blind decomposition of multivariate chemical substance data. The same comments apply as in relation to the previously cited US patent application 20050032231.

The patent application WO2008076680 (US2008147763) "Method and Apparatus for Using State Space Differential Geometry to Perform Nonlinear Blind Source Separation," presents quite general state space differential geometry based approach to nonlinear blind source separation. The set of application domains covered by claims is quite wide. The main assumption of the algorithm proposed in the cited application is that the number of mixtures that contain possibly nonlinear combinations of the pure component signals is greater than or equal to the number of pure components as well as that pure component signals are statistically independent. Hence, algorithm presented in the cited application can not separate more than two spectroscopic signals that are statistically dependent using smaller number of mixtures.

The patent application WO2007103037 (US2007004966) "System and Method for Generate a Separated Signal," applies a concept of independent vector analysis to separate multiple source signals from multiple mixtures, whereas the number of mixtures must be greater than or equal to the number of source signals. Hence, the algorithm presented in the cited application can not separate more than two spectroscopic signals using smaller number of mixtures.

The patent application US2006256978 "Sparse signal mixing model and application to noisy blind source separation," presents an algorithm for blind extraction of two or more signals from two mixtures only by transforming measured signals into time-frequency domain. The fundamental assumption made on the two source signals is that they are disjointly orthogonal, i.e. that at each time-frequency location only one source signal exists. This assumption is quite restrictive and even in the cited application it is stated that it approximately holds for voice signals only. The known method will not work in the case of spectroscopic signals, because the pure components are simultaneously active in time and frequency.

The patent application WO03090127 "Blind source separation utilizing a spatial fourth order cumulant matrix pencil," relates to novel method for blind separation of again statistically independent sources relying on fourth-order cumulants and generalized eigen-analysis. Said method suffers from the same limitations as mentioned above, namely (i) sources must be statistically independent and (ii) the number of mixtures must be equal to or greater than the number of sources.

The International patent application number PCT/HR2008/000037 relates to a method of and system for blind extraction of more than two pure components out of spectroscopic or spectrometric measurements of only two mixtures by means of sparse component analysis. Said known method for blind extraction of more than two pure components out of two mixtures that is based upon assumption that pure components do not overlap either in original recording domain or in some transformed domain. However, in the case of NMR spectroscopy it is practically impossible to satisfy no-overlap assumption when pure components represent complex chemical compounds such as those that arise in analyses of biological fluids (urine, blood plasma, cerebrospinal fluid, saliva, amniotic fluid, bile, tears, etc.) that include determination of certain metabolites or biomarkers.

Accordingly, it is the aim of the present invention to provide a method and system for blind extraction of more pure components than mixtures in 1D and 2D NMR spectroscopy and mass spectrometry, with particular emphasize to the cases when pure components represent complex chemical compounds such as those that arise in analyses of biological fluids (urine, blood plasma, cerebrospinal fluid, saliva, amniotic fluid, bile, tears, etc.) that include determination of certain metabolites or biomarkers or when great number (from few hundreds up to few thousands) of pure components is contained in the mixtures.

SUMMARY OF THE INVENTION

This aim is achieved by a method of blind extraction of more pure components than mixtures in 1D and 2D NMR spectroscopy and mass spectroscopy by means of combined use of sparse component analysis and detection of single component points, characterised in that said blind extraction comprises the following steps:

recording two or more mixtures data X wherein a recording domain of the mixture data is defined by equation [I]:

$$X=AS \quad [\text{I}]$$

where S is an unknown matrix of pure components and A is an unknown mixing or concentration matrix, storing the recorded two or more mixtures data, provided that mixtures data X [I] are 1D or 2D NMR spectroscopy data, transforming the mixtures data X into a wavelet domain by using wavelet transform $T_1$ wherein two or more transformed mixtures $T_1(X)$ are represented by equation [II]:

$$T_1(X)=AT_1(S) \quad [\text{II}]$$

and pure components in the wavelet representation domain defined by equation [II] are sparser than in recording domain defined by equation [I], detecting the single component points in the wavelet domain [II] $T_1$ where only one pure component is active according to direction based criterion [V], $$\left| \frac{R\{T_1(x_t)\}^T I\{T_1(x_t)\}}{\|R\{T_1(x_t)\}\|\|I\{T_1(x_t)\}\|} \right| \geq \cos(\Delta\theta) \quad [\text{V}]$$

where for the same predefined angular displacement $\Delta\theta$ significantly more SCPs will be identified in wavelet domain [II] than Fourier domain [III], estimating the number of pure components S present in the mixtures using two out of $n \geq 2$ mixtures from the set of detected single component points in wavelet domain defined by equation [II] by means of a clustering function, estimating the concentration matrix A from the set of detected single component points in wavelet domain defined by equation [II] by means of a data clustering algorithm, transforming 1D or 2D NMR mixtures data [I] into frequency domain by using Fourier transform $T_2$ wherein the transformed mixtures are represented by equation [III]:

$$T_2(X) = AT_2(S) \quad [III]$$

estimating the pure components $T_2(S)$ in the frequency domain [III] by means of linear programming, constrained convex programming or constrained quadratic programming, provided that mixtures data X [I] are mass spectrometry data, constructing analytical continuation of the real data X as represented in equation [IV]

$$\tilde{X} = X + jH(X) \quad [IV]$$

where H(X) represents Hilbert transform of X and $j=\sqrt{-1}$ represents imaginary unit, detecting the single component points in the analytical continuation [IV] where only one pure component is active by means of direction based criterion [V], $$\left| \frac{R\{\tilde{x}_t\}^T I\{\tilde{x}_t\}}{\|R\{\tilde{x}_t\}\| \|I\{\tilde{x}_t\}\|} \right| \geq \cos(\Delta\theta) \quad [V]$$

where $\Delta\theta$ is some predefined angular displacement, estimating the number of pure components S present in the mixtures using any two out of $n \geq 2$ mixtures from the set of detected single component points in recorded mixtures [I] by means of a clustering function, estimating the concentration matrix A from the set of detected single component points in recorded mixtures [I] by means of a data clustering algorithm, estimating the pure components from recorded mixtures [I] by means of linear programming, constrained convex programming or constrained quadratic programming, presenting the pure components.

Further, this aim is achieved by a system for blind extraction of more pure components than mixtures in 1D or 2D NMR spectroscopy and mass spectrometry by means of sparse component analysis and detection of single component points, comprising: a mixtures sensing device (1) for recording mixtures data X, an input storing device or medium (2) for storing the mixture data X recorded by the mixtures sensing device (1), a processor (3), wherein code is implemented or carried out for executing a method according to any one of claims 1 to 14 based on the mixtures data X stored in/on the input storing device or medium (2), an output storing device or medium (4) for storing the result of the method carried out by the processor.

Preferably, said method comprises selecting the estimated pure components in accordance with the negentropy-based ranking criterion and presenting the selected pure components.

Preferably, the transform $T_1$ is a wavelet transform with the symmlet wavelet of order 4 to 16.

Furthermore, conveniently the transform $T_2$ is a Fourier transform.

According to a special embodiment, single component points are detected using direction based criterion [V] in wavelet domain [III], when recorded data [I] are NMR spectroscopy data.

Conveniently, the clustering function is capable of estimating the number of pure components from the set of detected single component points in wavelet domain [II] and any two out of $n \geq 2$ mixtures.

Advantageously, the data clustering algorithm is capable of estimating the concentration matrix from the set of detected single component points in the wavelet domain [II] by means of standard data clustering algorithms such as for example k-means clustering, hierarchical clustering, fuzzy c-means clustering, etc.

Advantageously, a numerical method is used to estimate the pure components in the frequency domain [III] when mixtures data X are 1D or 2D NMR spectroscopy data, or original recording domain [I] when mixtures data X are mass spectrometry data, that is a linear programming method, a convex programming method with quadratic constraint ($l_2$-norm based constraint) or a quadratic programming method with $l_1$-norm based constraint.

Preferably, single component points are detected using direction based criterion [V] using analytical continuation [IV], when recorded data [I] are mass spectrometry mixtures.

In particular, preferably the clustering function is capable of estimating the number of pure components from the set of detected single component points in recorded mass spectrometry mixtures domain [I] and any two out of $n \geq 2$ mixtures.

In particular, the data clustering algorithm might be capable of estimating the concentration matrix from the set of detected single component points in the recorded mass spectrometry mixtures domain [I] by means of standard data clustering algorithms such as for example k-means clustering, hierarchical clustering, fuzzy c-means clustering, etc.

According to a further special embodiment, a method is applied to the identification of the compounds in chemical synthesis, food quality inspection or pollution inspection, i.e. environment protection.

Preferably, said method is applied to the identification of compounds obtained from natural sources (microorganisms, plants and animals), metabolites and biomarkers present in biological fluids (urine, blood plasma, cerebrospinal fluid, saliva, amniotic fluid, bile, tears, etc.) or tissues extracts.

Furthermore, the present invention provides a computer-readable medium having computer-executable instructions stored thereon, which, when executed by a computer, will cause the computer to carry out a method of the present invention.

In a preferred embodiment of the system, the output storing device is a printer or plotter and the output storing medium a memory based device that is computer-readable.

Finally, in a preferred embodiment of the system, the mixtures sensing device is a nuclear magnetic resonance (NMR) spectrometer or mass spectrometer.

The novelty of proposed invention in relation to PCT/2008/000037 is in the use of a set of detected single component points (SCPs) at which only one pure component is present, in estimation of the unknown number of pure components and corresponding concentration matrix. This leads to the more accurate estimation of more pure components than mixtures in 1D and 2DNMR spectroscopy and mass spectrometry, when pure components exhibit high level of complexity and similarity, leading consequently to serious overlapping in both 1D and 2D NMR spectra.

The idea of using SCPs for blind separation of components has been exploited in multispectral and hyperspectral data analysis under various names such as: pixel purity index (PPI) in J. W. Boardman, F. A. Kruse, and R. O. Green, "Mapping target signatures via partial unmixing of AVIRIS data," in Summaries of JPL Airborne Earth Science Workshop, Pasadena, Calif., 1995; fast iterative PPI in Ch.-I Chang, and A. Plaza, "A Fast Iterative Algorithm for Implementation of Pixel Purity Index," IEEE Geoscience and Remote Sensing Letters, vol. 3 (1) (2006), 63-67; the N-FINDR in M. E. Winter, "N-findr: An algorithm for fast autonomous spectral end-member determination in hyperspectral data," in Proc. SPIE Conf. Imaging Spectroscopy V, 1999, pp. 266-275.; the vertex component analysis in J. M. P. Nascimento, and J. M. Bioucas Dias, "Vertex Component Analysis: A Fast Algorithm to Unmix Hyperspecral Data," IEEE Trans. Geoscience and Remote Sensing, vol. 43 (2005) 898-909. What is in common to all these approaches to SCPs detection is an assumption that in the given data set is present at least one sample where only single component is active. This is a strong requisite and surely does not hold in many data sets especially those involved with 1D or 2D NMR spectra of complex bio-related mixtures. Biological fluids and tissue extracts contain hundreds to thousands of different compounds. This in turn leads to a large number of signals and results in considerable signal overlapping, especially in $^1$H NMR spectra, thus hampering accurate identification of targeted compounds. Spreading the signals over two or more dimensions will reduce overlap, but will not exclude it in more demanding cases. In addition to that elaborated methods are computationally demanding relying on complex geometrical concepts such as convex hulls, simplex or skewers.

As opposed to the SCPs detection approaches described in previous paragraph, proposed invention is based on idea to detect SCPs in either original or transformed domain using the criterion based on simple geometrical concept of direction. Such idea has been proposed for estimation of the concentration matrix (it was called mixing matrix in this reference) in: V. G. Reju, S. N. Koh, I. Y. Soon, "An algorithm for mixing matrix estimation in instantaneous blind source separation," Signal Processing 89 (2009) 1762-1773. The criterion for identification of the SCPs is to compare direction of real and imaginary parts of the measured data samples in Fourier or frequency domain. When real and imaginary parts are pointing to either the same or opposite directions the data samples are identified as SCPs. It is evident that proposed SCPs detection criterion requires complex data. In proposed invention we make two extensions/generalizations of the criterion used for the SCPs detection.

First generalization is related to applying SCPs detection criterion to data samples in wavelet instead in frequency (Fourier) domain. Wavelet transform is characterized by multiple resolution levels and multiple choices of wavelet functions. This generally yields higher level of sparseness than when data are transformed into Fourier domain. Hence, greater number of SCPs can be detected when appropriate resolution level and appropriate wavelet function are selected than when Fourier domain is used to represent transformed data. To detect SCPs and estimate concentration matrix in case of 1D and 2D NMR mixtures, 1D and 2D wavelet transforms are used respectively to represent NMR signals in wavelet domain. Since recorded time domain NMR signals are complex, their wavelet transforms are complex as well. Hence, direction-based detection criterion requiring complex representation can be used to detect SCPs. Thus, unlike SCPs detection criterion described in paragraph [00054] wavelet transform based approach to SCPs detection allows transformation of data into basis or representation where pure components are expected to be sparse. Due to this fact the probability that at least one sample or point will be found where only one pure component is active is increased significantly.

Second generalization of the SCPs detection criteria is related to its use when recorded data are real. Such situation arises in mass spectrometry. Complex representation of real signal is obtained through analytical continuation of the real signal. Analytical continuation of the real signal has real part that equals the real signal itself and has imaginary part that equals Hilbert transform of the real signal. Hence, detection criteria requiring complex representation can be used to detect SCPs.

BRIEF DESCRIPTION OF THE DRAWINGS

A more detailed description of the invention will be given with references to the following figures, in which.

DETAILED DESCRIPTION OF THE INVENTION

Figure 1:
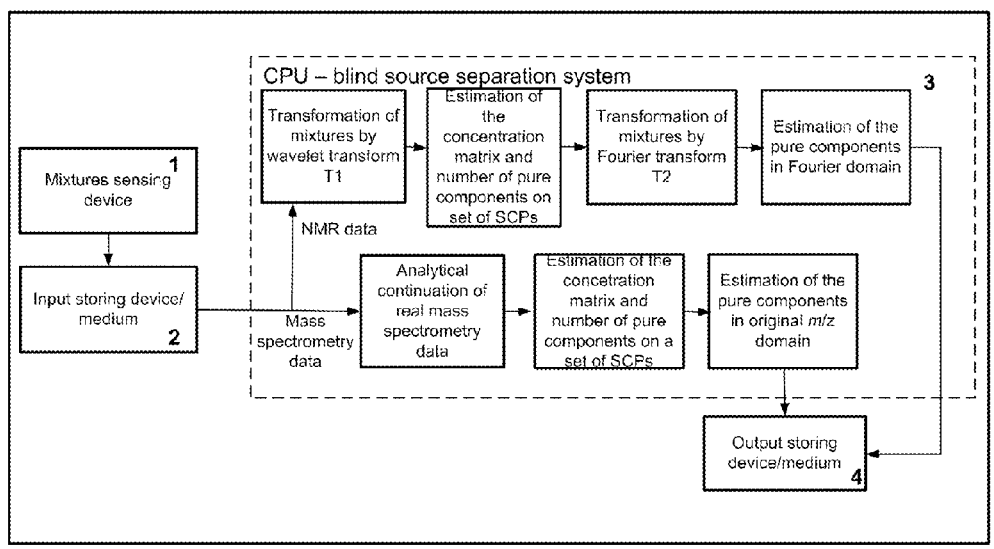
FIG. 1 schematically illustrates a block diagram of a device for blind extraction of more pure components than mixtures in 1D/2D NMR spectroscopy or mass spectrometry by means of combined sparse component analysis and detection of single component points according to an embodiment of the present invention.

A schematic block diagram of a device for blind extraction of more pure components than mixtures in 1D and 2D NMR spectroscopy and mass spectrometry that is defined by equation [I] and employing methodology of sparse component analysis combined with detection of SCPs according to an embodiment of the present invention is shown in FIG. 1. The device consists of: mixtures sensing device 1 used to gather 1D/2D NMR spectroscopy or mass spectrometry data; storing device 2 used to store gathered 1D/2D NMR spectroscopy or mass spectrometry data; CPU 3 or computer where algorithms for sparse component analysis in combination with detection of SCPs are implemented for blind extraction of pure components from gathered 1D and 2D NMR spectroscopy or mass spectrometry data; and output device 4 used to store and present extracted pure components.

The procedure for processing gathered and stored 1D/2D NMR spectroscopy or mass spectrometry mixture data with the aim to blindly extract pure components is implemented in the software or firmware in the CPU 3 and according to an embodiment of the present invention consists of the following steps: provided that recorded mixtures defined by equation [I] represent 1D or 2D NMR data, they are transformed by wavelet transform $T_1$ into wavelet representation domain defined by equation [II] with the aim to increase sparseness of the pure components; the transformed mixtures equation [II] are used for detection of points where only single pure components are active (single component points-SCPs); based on a set of detected SCPs the number of pure components and concentration matrix are estimated; recorded 1D or 2D NMR data [I] are transformed by Fourier transform $T_2$ into Fourier or frequency domain [III]; based on the estimated concentration matrix pure components are estimated by either linear programming, convex programming with constraints or quadratic programming with constrains using mixtures in Fourier or frequency domain defined by equation [III]; blindly extracted pure components are stored and presented in the final form on the output device or medium 4; provided that recorded mixtures defined by equation [I] represent mass spectrometry data, they are extended to analytical continuation defined by equation [IV]; analytically extended mixtures are used for detection of points where only single pure components are active; based on a set of indexes of detected SCPs the number of pure components and concentration matrix are estimated from a corresponding subset of the recorded real mass spectrometry mixture data defined by equation [I]; based on the estimated concentration matrix pure components are estimated by either linear programming, convex programming with constraints or quadratic programming with constrains using mixtures in recorded domain defined by equation [I]; blindly extracted pure components are stored and presented in the final form on the output device or medium 4.

In detail, according to an embodiment of the present invention procedure for blind extraction of more pure components than mixtures recorded in 1D/2D NMR spectroscopy or mass spectrometry consists of the following steps:

recording two or more mixtures data X defined by equation [I] with mixtures sensing device 1, for 1D or 2D nuclear magnetic resonance spectroscopy or mass spectrometry, wherein mixtures are defined as a product of an unknown mixing matrix A (also called concentration matrix) and matrix of the unknown pure components S, if recorded mixtures data X represent NMR data, transforming them from an original domain represented by equation [I] into a wavelet representation domain defined by equation [II] by means of the wavelet transform $T_1$, wherein transformed mixtures $T_1(X)$ represented by equation [II] are defined as a product of the mixing matrix A and transformed matrix of the pure components $T_1(S)$, estimating the concentration matrix A and number of pure components S by means of a data clustering algorithm on a set of single component points detected in wavelet representation domain $T_1(X)$ defined by equation [II], estimating the pure components $T_2(5)$ in the Fourier or frequency domain defined by equation [III] (obtained by transforming recorded mixtures defined by equation [I] by Fourier transform $T_2$) by means of linear programming, convex programming with constraints or quadratic programming with constrains, if recorded mixtures data X represent mass spectrometry data, expanding them from an original real signal domain defined by equation [I] into complex analytical continuation domain defined by equation [IV], identifying subset of indexes of single component points using analytic representation of the mixture data X defined by equation [IV], estimating the concentration matrix A and number of pure components S by means of a data clustering algorithm on a subset of original mixture data X [I] defined by identified subset of indexes, selecting estimated pure components of interest in accordance with negentropy-based ranking criterion, and storing and presenting selected pure components at the chosen output device 4.

Figure 2G:
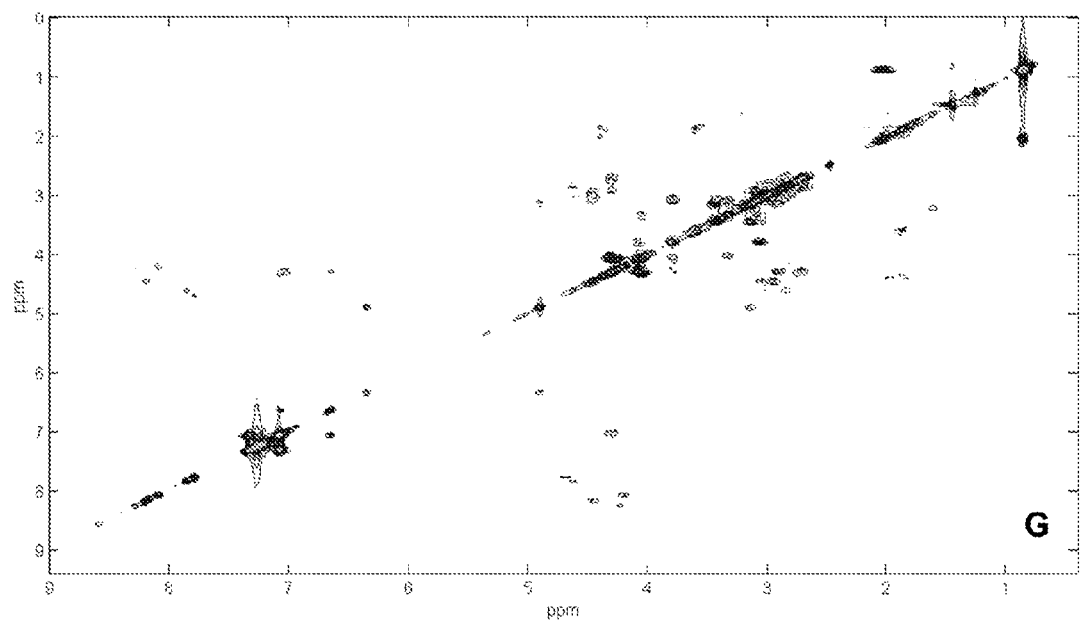
FIGS. 2A to 2X demonstrate experimental blind extraction of four pure components COSY (correlation spectroscopy) spectra from three mixtures by means of sparse component analysis and SCPs detection.
Figure 2J:
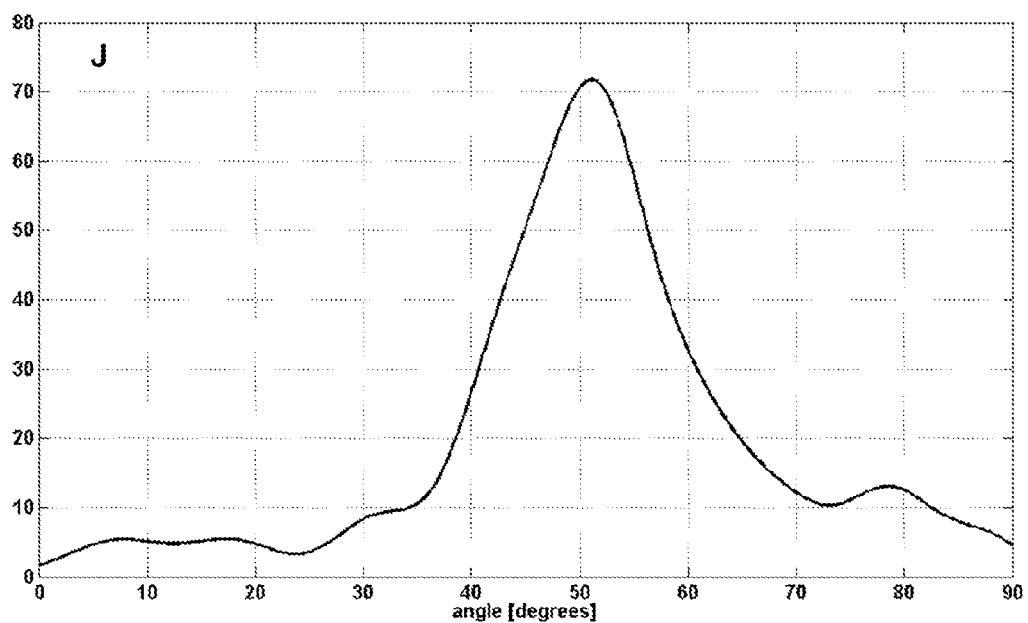
Figure 2Q:
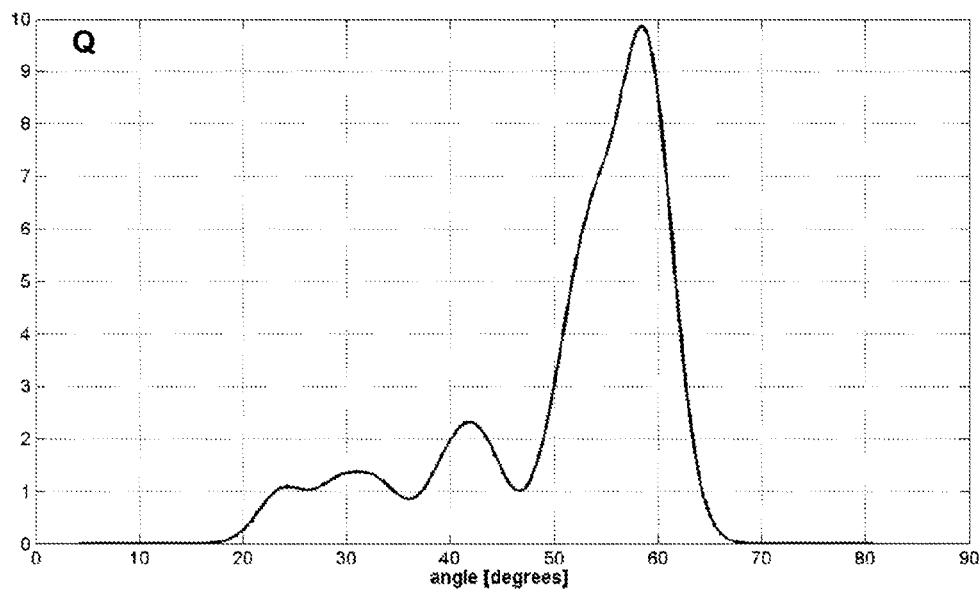

FIGS. 2A to 2X demonstrate experimental blind extraction of four pure components COSY spectra from three mixtures by means of sparse component analysis and single component points detection according to an embodiment of the present invention. Compounds used in this analysis belong to a class of synthetically obtained glycopeptides. Dipeptide-, tripeptide- and tetrapeptide-related glucosyl esters exhibit large structural similarities and significant overlapping in NMR spectra. FIGS. 2A to 2D show COSY spectra (in the Fourier basis) of the four pure components. FIGS. 2E to 2G show COSY spectra of the three mixtures. FIGS. 2H to 2J show clustering functions in the mixing angle domain for three two-dimensional subspaces $X_1X_2$, $X_1X_3$ and $X_2X_3$. Clustering functions were calculated on a set of 203 single component points detected in 2D wavelet domain [II], i.e. $T_1$ was 2D wavelet transform, with symmlet wavelet of order 8 and SCPs detection criterion [V] with tolerance $\Delta\theta1°$. There are four peaks in clustering functions 2H to 2J suggesting existence of four pure components in the mixtures. The amplitude spectra of the estimated pure components that correspond to the four true pure components are shown in FIGS. 2K to 2N. Since concentration matrix is estimated accurately on a subset of SCPs $l_1$-regularized least square problem will yield good estimate of the pure components even when two pure components occupy the same frequency. Similarity between true and estimated pure components is quantified in FIG. 2W, where normalized correlation coefficients between estimated and true pure components are shown. For the reference, FIG. 2V yields normalized correlation coefficients between the true pure components. It is evident that they are significantly correlated. Based on this, results presented in FIGS. 2K to 2N and FIG. 2W can be considered good. To demonstrate importance of the wavelet basis, we show in FIGS. 2R to 2U amplitude spectra of the estimated pure components when Fourier basis was used to detect single component points. FIGS. 2O to 2Q show clustering functions in the mixing angle domain for three two-dimensional mixture subspaces $X_1X_2$, $X_1X_3$ and $X_2X_3$. With SCPs detection criterion [V] with tolerance $\Delta\theta=2°$, only 23 single component points were detected. Hence, although the tolerance was two times greater than in the case of wavelet basis, almost ten times less SCPs were detected. This illustrates importance of the wavelet basis for NMR signals. FIG. 2X gives normalized correlation coefficients between the true pure components and pure components estimated by $l_1$-regularized least square algorithm, whereas number of pure components and concentration matrix are estimated on the basis of 23 SCPs. As can be seen from FIG. 2X pure components 3 and 4 are not well separated due to the fact the estimate of the pure component 4 is more correlated with the pure component 3 than with the pure component 4.

Figure 3A:
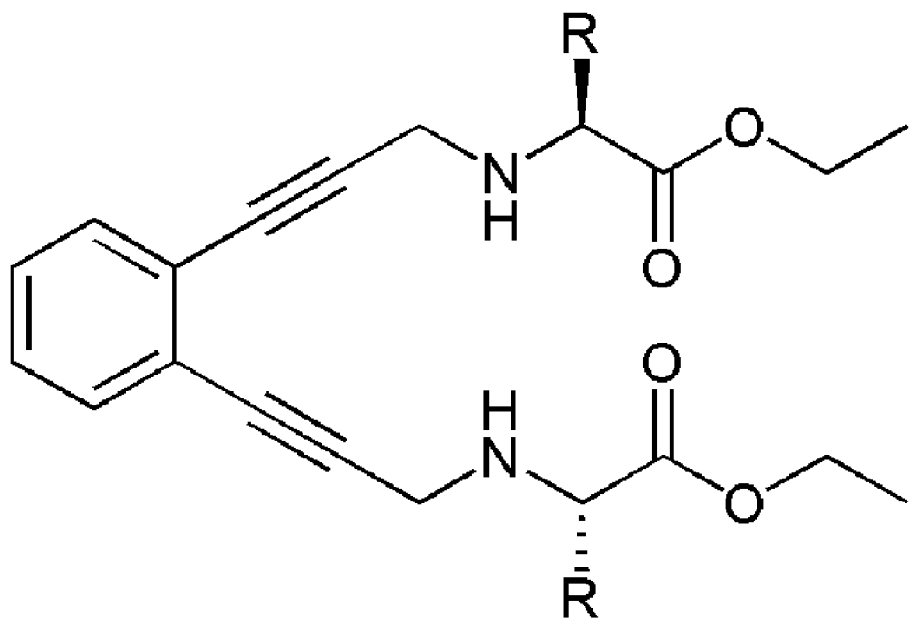
FIGS. 3A to 3P demonstrate experimental blind extraction of five pure components mass spectra from two mixtures by means of sparse component analysis and SCPs detection.
Figure 3F:
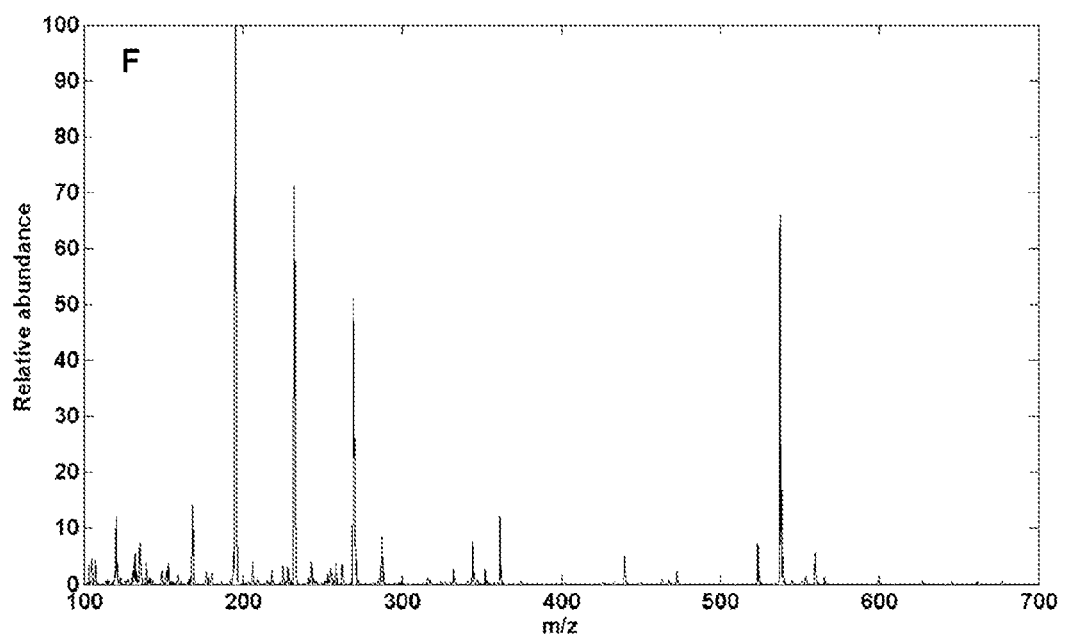
Figure 3I:
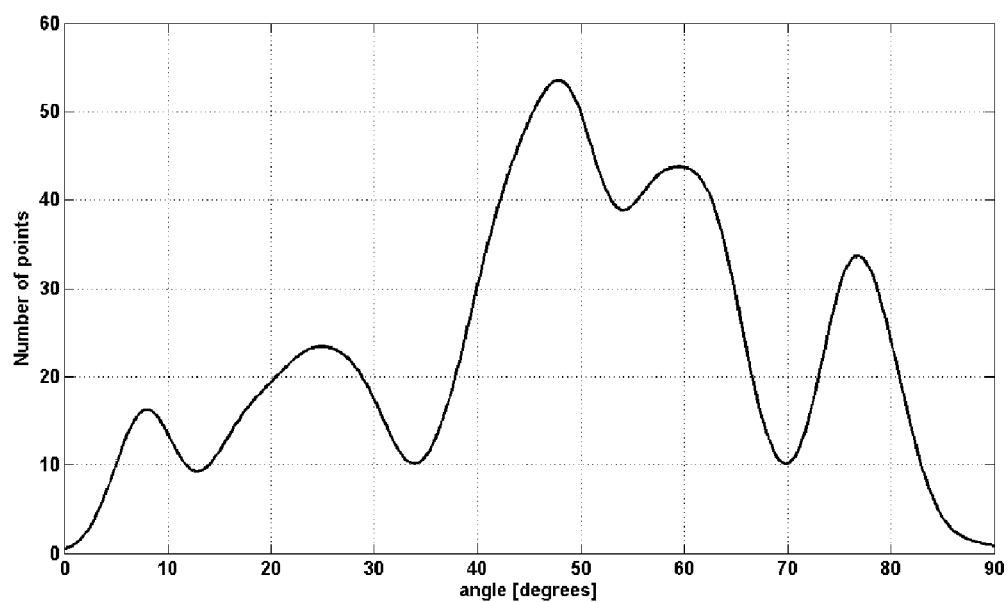
Figures 3N, 3O, 3P:
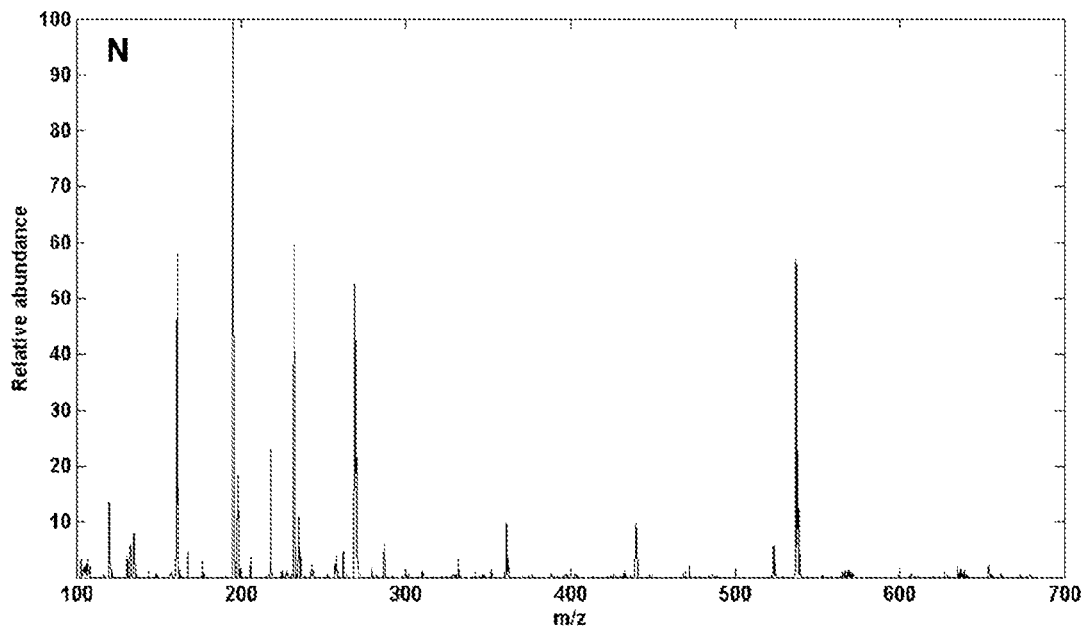

FIGS. 3A to 3M demonstrate experimental blind extraction of five pure components from two mass spectra mixtures by means of sparse component analysis and single component points detection and according to an embodiment of the present invention. Pure components 1-5, shown in FIG. 3A belong to a class of symmetrical enediyne-bridged compounds derived from glycine, alanine, valine, leucine and phenylalanine. FIGS. 3B to 3F show mass spectra of pure components 1-5. FIGS. 3G and 3H show mass spectra of two mixtures consist of compounds 1-5. FIG. 3I shows clustering function in the mixing angle domain for two-dimensional mixture space X1X2. Clustering function was calculated on a set of 290 single component points detected on analytical continuation [V] of recorded mass spectra [I] and SCPs detection criterion [V] with tolerance $\Delta\theta=20$. There are five peaks in clustering function 3I suggesting existence of five pure components in the mixtures. Mass spectra of the estimated pure components that correspond to the five true pure components are shown in FIGS. 3J to 3N. Visual impression reflects high degree of similarity between true and estimated pure components. Similarity between true and estimated pure components is quantified in FIG. 3P where normalized correlation coefficients between estimated and true pure components are shown. For the reference, FIG. 3O yields normalized correlation coefficients between the true pure components. It is evident that they are weakly correlated. Thus, estimation of both concentration matrix on a set of 290

SCPs through data clustering and pure components, based on estimated concentration matrix, using linear programming was not so demanding task as previously described 2D NMR case. It was however demanding from the fact that five pure components ought to be estimated from two mixtures only.

The present invention relates to the field of 1D and 2D NMR spectroscopy and mass spectrometry. More specific, the invention relates to the combined application of the methods of sparse component analysis and detection of single component points for blind extraction of more pure chemical compounds than recorded number of spectroscopic or spectrometric mixtures, wherein mixtures are gathered by NMR spectroscopy or mass spectrometry. Proposed blind pure components extraction approach estimates the unknown number of pure components and concentration matrix from the subset of mixtures samples where only one pure component is active. This subset is identified using complex representation of spectroscopic or spectrometric signals and detection criterion based on geometrical concept of direction according to equation [V]. For NMR signals SCPs are identified in wavelet domain [II] while for mass spectrometry signals SCPs are identified on analytical continuation [IV] of the real mass spectrometry mixtures data [I]. Identified pure components can be used for identification of chemical compounds in chemical synthesis, food quality inspection or pollution inspection i.e. environment protection, identification of compounds obtained from natural sources (microorganisms, plants and animals), metabolites and biomarkers present in biological fluids (urine, blood plasma, cerebrospinal fluid, saliva, amniotic fluid, bile, tears, etc.) or tissue extracts.

The specific case of blind extraction of pure components in which the number of there is less than or equal to the number of mixtures could be solved by the proposed invention as well. However, such solution would be computationally too costly and other computationally more efficient methods can be used for this specific case.

The enabling concept for the solution of the problem of blind extraction of more pure components than mixtures is known under the common name sparse component analysis (SCA), while the problem itself is called underdetermined blind source separation (uBSS). Theoretical foundations of the solution of the uBSS problem employing SCA are laid down in: P. Bofill and M. Zibulevsky, "Underdetermined blind source separation using sparse representations. Signal Processing 81, 2353-2362, 2001; Y. Li, A. Cichocki, S. Amari, "Analysis of Sparse Representation and Blind Source Separation," Neural Computation 16, pp. 1193-1234, 2004; Y. Li, S. Amari, A. Cichocki, D. W. C. Ho, S. Xie, "Underdetermined Blind Source Separation Based on Sparse Representation," IEEE Trans. On Signal Processing, vol. 54, No. 2, 423-437, 2006; P. Georgiev, F. Theis, and A. Cichocki, "Sparse Component Analysis and Blind Source Separation of Underdetermined Mixtures," IEEE Trans. On Neural Networks, vol. 16, No. 4, 992-996, 2005.

Let us assume the number of mixtures to be n and the unknown number of pure components to be m, as well as that $m > n \geq 2$. The uBSS problem is solvable by SCA approach, if pure components in some domain are (m−n+1)-sparse what implies that at each coordinate (for example frequency in Fourier basis) m−n+1 components are zero. By setting the number of mixtures to be n=2 this implies that at each coordinate in the domain of representation m−1 pure components must be zero, i.e., the assumption is that pure components do not overlap in the representation domain. This assumption is very strong and is difficult to fulfil for NMR signals of complex chemical compounds such as proteins or those compounds that are isolated from biological samples. In such situations, to blindly extract more pure components than number of mixtures several steps have to be combined: number of mixtures needs to be increased from n=2 to n=3 (or maybe even to n=4), see description in paragraph [0065] for 2D NMR spectra of glycopeptides; to estimate concentration matrix and number of pure components accurately subset of points where only one pure components is active must be identified using detection criterion [V]. These SCPs are then used to estimate the number of pure components and concentration matrix by means of data clustering algorithms; to identify greater number of SCPs, recorded mixtures NMR data [I] are transformed into wavelet basis [II]; to apply SCPs detection criterion [V] to mass spectrometry data [I] they ought to be expanded into analytical representation or analytical continuation [IV].

As already elaborated, the number of pure components present in the recorded mixtures is always unknown. Accurate estimation of this number is a challenging task and is accomplished by fairly complex statistical methods such as maximum likelihood, bootstrapping and jack-knifing: F. Westad, M. Kermit, "Cross validation and uncertainty estimates in independent component analysis," Analytica Chimica Acta 490, 341-354, 2003; E. Levina et al., "Estimating the number of pure chemical components in a mixture by maximum likelihood," Journal of Chemometrics 21, 24-34, 2007. These methods are based on statistical ranking of the singular values of the sample data covariance matrix by discarding those that may be associated with outliers or chemical noise. In solving uBSS problems such methods can not be applied, since the number of pure components exceeds the overall number of singular values that equals the number of mixtures. Consequently, there are more pure components to rank than the number of singular values available.

According to the present invention the unknown number of pure components and concentration matrix are estimated on a set of samples, where only one pure component is active. Use of points of single component activity is not new. It has been exploited in DUET algorithm: A. Jourjine, S. Rickard, and O. Yilmaz, in Proc. Int. Conf. on Acoust., Speech, Signal Processing, 2000, vol. 5, pp. 2985-2988, for the separation of speech signals, wherein it has been assumed that at each point in time-frequency plane only one source (speech) signal is active. As discussed previously, this assumption is not true for time-frequency representation of NMR signals of complex chemical compounds. In references: V. G. Reju, S. N. Koh, I. Y. Soon, "An algorithm for mixing matrix estimation in instantaneous blind source separation," Signal Processing 89 (2009) 1762-1773; and S. G. Kim, Ch. D. Yoo, "Underdetermined Blind Source Separation Based on Subspace Representation," IEEE Trans. On Signal Processing 57 (2009) 2604-2614, two criteria were proposed to detect points of single component activity in the Fourier domain. Both of these criteria require complex representation of signals. In the present invention we use criterion proposed in: V. G. Reju, S. N. Koh, I. Y. Soon, "An algorithm for mixing matrix estimation in instantaneous blind source separation," Signal Processing 89 (2009) 1762-1773. It is based on the notion that real and imaginary parts of the complex vector of mixtures data point either in the same or in the opposite directions at the point, where only single pure component is active. Let us denote by $x_t$ the complex vector of the mixtures data at the sample t. This sample belongs to the SCPs set, if the following criterion is satisfied $$\left| \frac{R\{x_t\}^T I\{x_t\}}{\|R\{x_t\}\| \|I\{x_t\}\|} \right| \geq \cos(\Delta\theta) \quad [V]$$

where $R\{x_t\}$ and $I\{x_t\}$ respectively denote real and imaginary part of $x_t$, 'T' denotes transpose operation, $\|R\{x_t\}\|$ and $\|I\{x_t\}\|$ denote $l_2$-norms of $R\{x_t\}$ and $I\{x_t\}$ and $\Delta\theta$ denotes angular displacement from the direction of either 0 or $\pi$ radians. Evidently, the smaller $\Delta\theta$ is, the smaller number of candidates for SCPs will be identified. However, the accuracy of estimation of the number of pure components and concentration matrix will be greater. Thus, it is of great importance to find out representation domain, where pure components will be mutually sparse and where the greater number of SCPs will be identified for smaller displacement $\Delta\theta$.

1D and 2D NMR data recorded in time domain are not sparse at all. In paragraph [0065] we have demonstrated that COSY spectra of three mixtures containing four pure glycopeptides-related components, when transformed into Fourier domain contained only 23 SCPs according to the criterion [V] with the tolerance $\Delta\theta=2°$. Therefore, we proposed to transform time domain 2D NMR data [I] into 2D wavelet domain with symmlet wavelet of order 8. In such a case, 203 SCPs are detected with the tolerance $\Delta\theta=1°$. Thus, when NMR spectroscopy data are considered, instead of applying SCPs detection criterion [V] in Fourier domain (as suggested in: V. G. Reju, S. N. Koh, I. Y. Soon, "An algorithm for mixing matrix estimation in instantaneous blind source separation," Signal Processing 89 (2009) 1762-1773), we apply it in 1D or 2D wavelet domain with suitably chosen wavelet function.

As described in paragraph [0069], SCPs detection criterion [V] requires complex representation of mixtures data. In order to apply this criterion to detect SCPs of real signals, such as mass spectrometry mixtures data, we propose to expand real mass spectrometry data [I] into complex analytical continuation [IV]. Paragraph [0066] describes experimental results of applying this concept to blind extraction of five pure components from two mixtures mass spectra.

Number of pure components is identified from a subset of SCPs using clustering function described in paragraph [0082]. Since each pure component is expected to be contained in each mixture, any two-dimensional subspace in the mixture space can be used for this purpose. Concentration matrix is estimated on a subset of SCPs using some of the data clustering algorithms such as: k-means clustering, hierarchical clustering, fuzzy clustering, or clustering based on k-dimensional concentration subspaces as described in: F. M. Naini et al., "Estimating the mixing matrix in Sparse Component Analysis (SCA) based on partial k-dimensional subspace clustering," Neurocomputing 71, 2330-2343, 2008. The k-means clustering algorithm is proposed, if the number of mixtures is n>2, while 1-dimensional concentration subspaces approach is proposed, when n=2. Since on identified set of SCPs pure components do not overlap, proposed data clustering algorithms will yield accurate estimation of the concentration matrix.

When the concentration matrix is estimated, the pure components are recovered by solving an underdetermined system of linear equations. For 1D or 2D NMR spectroscopy data this is Fourier or frequency domain [III], while for mass spectrometry data this is recording domain [I]. If the pure components are in average m−n+1 sparse, the solution can be obtained by several methods that are based on constrained convex optimization: J. A. Tropp, A. C. Gilbert, "Signal Recovery From Random Measurements Via Orthogonal Matching Pursuit," IEEE Transactions on Information Theory, vol. 53, No. 12, 4655-4666, 2007; S. J. Kim et al., "An Interior-Point Method for Large-Scale $l_1$-Regularized Least Squares," IEEE Journal of Selected Topics in Signal Processing, vol. 1, No. 4, 606-617, 2007. Moreover, it has been proven (I. Takigawa, M. Kudo J. Toyama, "Performance Analysis of Minimum l1-Norm Solutions for Underdetermined Source Separation," IEEE Tr. On Signal Processing, vol. 52, No. 3, 582-591, 2004) that linear programming yields perfect solution when concentration matrix is known and when no more than n sources are active at each coordinate, i.e. when sources are (m−n)-sparse. Hence, linear programming or its equivalents based on $l_1$-norm minimization will yield a robust solution of the blind decomposition problem, if no more than n pure components are active at each coordinate in frequency domain [III] for 2D NMR data or original m/z domain [I] for mass spectrometry data.

The problem of the blind extraction of more pure components than recorded mixtures by means of the SCA algorithms can algebraically be expressed as a matrix factorization problem $X \in R^{m \times N}$ by means of which recorded mixtures are represented by equation [I]:

$$X = AS \quad [I]$$

In equation [I] X represents recorded mixtures data, where $A \in R^{n \times m}_{0+}$ represents unknown concentration matrix and $S \in R^{m \times N}$ represents matrix of the unknown pure components. In adopted notation n represents number of recorded NMR spectroscopy or mass spectrometry mixtures, N represent number of samples in the mixture, and m represents unknown number of the pure components. In the adopted scenario it presumed that m>n≥2, i.e. resulting blind source separation problem is underdetermined. When referring to individual sample of the mixtures we shall use notation $x_t$, whereas 1≤t≤N. Such kind of blind problems can not be solved by means of the ICA algorithms discussed in paragraphs [0004] and [0005].

As previously discussed in paragraphs [00065]-[00073], underdetermined blind source separation problem is solvable if pure components are m−n+1 sparse. Actually m−n+1 level of sparseness is required by data clustering algorithms to accurately estimate concentration matrix and number of pure components present in the mixtures. That is why detection of SCPs described in paragraphs [0075]-[0077] is of great importance. Provided that concentration matrix is estimated accurately, linear programming based signal reconstruction will yield accurate estimate of the pure components, even when n pure components occupy the same coordinate in the chosen representation domain. This result has been proven in: I. Takigawa, M. Kudo, J. Toyama, "Performance Analysis of Minimum l1-Norm Solutions for Underdetermined Source Separation," IEEE Tr. On Signal Processing, vol. 52, No. 3, 582-591, 2004.

When recorded mixtures [I] represent time domain NMR data, wavelet transform $T_1$ is proposed to transform recorded mixtures into new domain [II]

$$T_1(X) = AT_1(S) \quad [II]$$

Proper combination of resolution level in the wavelet transform and wavelet function will yield representation of the pure components, such that significant number of SCPs can be detected using criterion [V]. In the present invention we use for wavelet function symmlets of order 4 to 16 to transform NMR data from time to wavelet domain. Set of detected SCPs contains samples in wavelet domain at which pure components are m−1 sparse, i.e. they do not overlap. Hence, data clustering algorithms will yield accurate estimate of the concentration matrix and number of pure components present in the mixture.

When recorded mixtures [I] represent mass spectrometry data, no new representation domain is sought. To detect SCPs by means of criterion [V], analytical continuation [IV] of the mass spectrometry data [I] is necessary, see description in paragraph [0036]. Set of detected SCPs points contains samples in recorded mass spectrometry mixtures data [I] at which pure components are m−1 sparse, i.e. they do not overlap. Hence, data clustering algorithms will yield accurate estimate of the concentration matrix and number of pure components present in the mixture.

The number of unknown pure components m contained in recorded mixtures defined by equation [I] has to be estimated. As elaborated in [0071], advanced statistical methods developed for overdetermined BSS problems (m>n) are not applicable to underdetermined BSS problem. According to an embodiment of the present invention we presume that each pure component is present in each mixture. Therefore, the number of pure components can be estimated on the 2D subspace of the mixture space. For this purpose we adopt the approach proposed in: F. M. Naini et al., "Estimating the mixing matrix in Sparse Component Analysis (SCA) based on partial k-dimensional subspace clustering," Neurocomputing 71, 2330-2343, 2008. Assuming the 2D dimensional subspace in the mixture space, we model the column mixing vector as unit length vector $a=[\cos(\phi)\sin(\phi)]^T$ with mixing angle describing its position in the 2D coordinate system spanned by mixtures $x_i$ and $x_j$. Since the elements of mixing vector have the chemical interpretation of concentrations of the pure components in the mixtures, they are nonnegative. Thus, the mixing angle is confined in the interval $[0, \pi/2]$.

Provided that small samples of the selected two mixtures $x_i$ and $x_j$ are eliminated and that remaining samples are normalized to unit length, the following function $$f(a) = \sum_{i=1}^{\bar{N}} \exp\left(-\frac{d^2(F(x_i), a)}{2\sigma^2}\right)$$

clusters mixtures data into the clusters, the number of which corresponds to the number of pure components. If recorded mixtures data [I] are 1D or 2D NMR data, F(x) represents samples in 1D or 2D wavelet domain [III]. If recorded mixtures [I] are mass spectrometry data, F(x) represents samples in recorded domain [I]. $\bar{N} \leq N$ denotes the number of samples that remained, after small samples elimination process. In the clustering function f(a), d denotes distance calculated as $d((F(x_i),a))=\sqrt{1-(F(x_i)\cdot a)^2}$ and $(F(x_i)\cdot a)$ denotes the inner or dot product. Parameter σ defines the resolving power of the function f(a). When σ is set to a sufficiently small value, in our experiments this turned out to be σ≈0.05, the value of the function f(a) will approximately equal the number of data points close to a. Positions of the centers of the clusters in the space of mixing angles correspond to the mixing angles that define the mixing vectors. FIGS. 2H to 2J show the clustering functions for 2D NMR data in 2D wavelet domain on a set of 203 SCPs, whereas 2D subspaces in the mixture space were respectively $x_1$-$x_2$, $x_1$-$x_3$, $x_2$-$x_3$. Corresponding clustering functions in Fourier domain on a set of 23 SCPs are shown in FIGS. 2O to 2Q. For more detailed description see [00061]. FIG. 3I shows clustering function for two mixtures mass spectrometry data on a set of 290 SCPs detected using analytical continuation of the mass spectrometry data [IV] and detection criterion [V]. For more detailed description see [0066].

After the number of pure components present in the mixture is estimated on 2D subspaces, the concentration matrix itself ought to be estimated from the set of SCPs. If the overall number of mixtures was n=2, the clustering algorithm described in previous paragraph [00078] yields also the estimate of the concentration matrix, because the centroid of each cluster represents vector of concentrations of the corresponding pure component. If the number of mixtures n is greater than 2, data clustering algorithm described in paragraph [00078] becomes computationally very costly due to the fact that it is based on (n−1)-dimensional search procedure. Therefore, for scenarios when n>2 we propose use of standard data clustering algorithms such as: k-means, hierarchical clustering, fuzzy clustering, etc. These data clustering algorithms are described in: G. Gan, Ch. Ma, and J. Wu, *Data Clustering—Theory, Algorithms and Applications*, SIAM, 2007. Results reported in paragraph [00061] and FIGS. 2A to 2X that were related to blind extraction of four pure components from three mixtures of 2D NMR data were obtained using k-means algorithm. Results reported in paragraph [0066] and FIGS. 3A to 3P that were related to blind extraction of five pure components from two mixtures of mass spectrometry data were obtained by data clustering algorithm described in paragraph [0082].

After the number of pure components and the mixing matrix are estimated, the pure components themselves ought to be estimated. This can be achieved in Fourier or frequency domain [III], if 1D or 2D NMR data are considered or in original recorded domain [I], if mass spectrometry data are considered. Provided that pure components in these domains are m−n sparse, i.e. that at most n pure components are present in each mixture in these domains, linear programming will yield accurate solution for the estimate of the pure components in the domain [III] for NMR data and domain [I] for mass spectrometry data. This result has been proven in: I. Takigawa, M. Kudo J. Toyama, "Performance Analysis of Minimum l1-Norm Solutions for Underdetermined Source Separation," IEEE Tr. On Signal Processing, vol. 52, No. 3, 582-591, 2004. Other methods for estimation of the pure components that are equivalent to the linear programming approach are: $l_1$-regularized least square solution known as interior-point method (Kim, S. J., Koh, K., Lustig, M., Boyd, S., Gorinevsky, D., "An Interior-Point Method for Large-Scale $l_1$-Regularized Least Squares," IEEE Journal of Selected Topics in Signal Processing, 1(4), 606-617, 2007); and other methods that belong to the group of convex relaxation based methods.

As explained in paragraph [0081], the number of pure components is estimated employing a data clustering algorithm [0082] on a set of SCPs. The sensitivity of the clustering function is regulated through the dispersion factor δ. Since the experimental data can contain errors due to the presence of chemical noise or outliers, as discussed in the US patent application 20040111220 in paragraph [0015], it is necessary to derive a robust estimator of the number of pure components. For this purpose we propose to slightly variate the dispersion factor δ and estimate the mixing matrix, related number of pure components m and pure components themselves for each value of δ. To evaluate the quality of the estimates of the mixing matrix and pure components, we propose to use the root-mean-squared-error (RMSE) criterion between original and reconstructed data as for example in: G. Wang, W. Cai, X. Shao, "A primary study on resolution of overlapping GC-MS signal using mean-field approach independent component analysis," Chemometrics and Intelligent Laboratory Systems 82, 137-144, 2006.

$$RMSE(m) = \sqrt{\frac{\sum_{i=1}^{n}\sum_{j=1}^{N}\left(x_i(j) - \sum_{k=1}^{m} a_{ik}s_k(j)\right)^2}{nN}}$$

As the solution for the mixing matrix A and pure components S, we present the one that minimizes RMSE criterion.

When working with experimental data, the presence of outliers (sources that are not pure components in the true sense but are the consequence of chemical noise or other imperfections present in the real world applications) must be allowed. In order to discriminate estimated pure components that correspond to the true pure components from the outliers we propose an information theoretic measure called negentropy: A. Hyvärinen, J. Karhunen, E. Oja. Independent Component Analysis, John Wiley, 2001. Negentropy is entropy defined relatively in relation to the entropy of the Gaussian random process. Since the Gaussian random process has the largest entropy its negentropy will be zero. The more informative (non-Gaussian) the random process is, the largest negentropy it has. Since we intuitively expect the pure components to be informative, we also expect their negentropies to be large. As opposed to that we expect the negentropies of the possible outliers to be small.

The present invention is related to blind extraction of more pure components than mixtures of the chemical compounds by means of combined use of sparse component analysis and detection of single component points. As opposed to the state-of-the art blind spectra decomposition methods that require the number of mixtures to be equal to or greater than the unknown number of pure components, paragraphs [0003]-[0013], approach proposed in this invention allows the number of mixtures to be smaller than number of pure components to be extracted. The invention is based on detection of samples at which only one pure component is active using simple geometrical criterion based on direction [V]. For 1D and 2D NMR signals 1D and 2D wavelet basis [II] are proposed for selection of the points where single pure components are active. For mass spectrometry data analytical continuation [IV] is used for the same purpose. Based on a set of SCPs, present invention is capable to automatically determine the number of pure components present in the mixtures. This is in contrast to many existing blind source separation methods.

The present invention blindly extracts more pure components than mixtures and estimates the unknown number of pure components and concentration matrix on a set of SCPs using data clustering algorithm commented in paragraphs [0081] and [0082]. The process of detection of SCPs for NMR spectroscopy data is carried out in wavelet basis [II] and is described in paragraphs [0036], [0078], [0079], whereas the detection criterion [V] is described in paragraph [0072]. The process of detection of SCPs for mass spectrometry data is carried out using analytical continuation [IV] and is described in paragraphs [0036], [0074], [0080]. The present invention estimates the mixing matrix on a set of SCPs using data clustering algorithms described in paragraphs [0082] and [0083]. Accurate estimations of the number of pure components and concentration matrix are ensured due to the fact that pure components do not overlap in a set of detected SCPs. It is demonstrated in the invention that for 2D NMR data, a significant number of SCPs can be found in the wavelet basis, when pure components represent chemical compounds with high degree of similarity, such as glycopeptides, but only a few SCPs can be found in the Fourier basis i.e. frequency domain.

The invention can be applied to identification of the compounds in the pharmaceutical industry in the chemical synthesis of new compounds with different properties. It can also be applied in the food quality inspection and environment protection through pollution inspection. Another application of the proposed invention is in software packages, as the built in computer code, that are used for the analysis and identification of the chemical compounds. Possibly the most important application of the proposed invention is in instrumental diagnostics; determination and identification of biomarkers present in biological fluids (urine, blood plasma, cerebrospinal fluid, saliva, amniotic fluid, bile, tears, etc.) or tissues extracts; detection of pathologies (genetically determined diseases), detection of patients with predisposition for certain disease, monitoring the responses of organism to the action of pharmaceuticals, pathogens or toxic compounds (wars, natural or ecology disasters).

The features in the foregoing description, in the claims and/or in the accompanying drawings may, both and in any combination thereof, be material for realising the invention in diverse forms thereof.

What is claimed is:

1. A method of blind extraction of more pure components than mixtures in 1D and 2D NMR spectroscopy and mass spectroscopy by combined use of sparse component analysis and detection of single component points, comprising the following steps:

recording two or more mixtures data X using a mixtures sensing device wherein a recording domain of the mixture data is defined by equation [I]:

$$X = AS \quad [\text{I}]$$

where S is an unknown matrix of pure components and A is an unknown mixing or concentration matrix, storing the recorded two or more mixtures data in a data storing device, executing instructions on a processor of an instruction executing computer for:

provided that mixtures data X [I] are 1D or 2D NMR spectroscopy data, transforming the mixtures data X into a wavelet domain by using wavelet transform $T_1$ wherein two or more transformed mixtures $T_1(X)$ are represented by equation [II]:

$$T_1(X) = AT_1(S) \quad [\text{II}]$$

and pure components in the wavelet representation domain defined by equation [II] are sparser than in recording domain defined by equation [I], detecting the single component points in the wavelet domain [II] $T_1$ where only one pure component is active according to direction based criterion [V], $$\left| \frac{R\{T_1(x_t)\}^T I\{T_1(x_t)\}}{\|R\{T_1(x_t)\}\| \|I\{T_1(x_t)\}\|} \right| \geq \cos(\Delta\theta) \quad [\text{V}]$$

where for the same predefined angular displacement $\Delta\theta$ significantly more single component points will be identified in wavelet domain [II] than Fourier domain [III], estimating the number of pure components S present in the mixtures using two out of n≧2 mixtures from the set of detected single component points in wavelet domain defined by equation [II] by means of a clustering function, estimating the concentration matrix A from the set of detected single component points in wavelet domain defined by equation [II] by means of a data clustering algorithm, transforming 1D or 2D NMR mixtures data [I] into frequency domain by using Fourier transform $T_2$ wherein the transformed mixtures are represented by equation [III]:

$$T_2(X) = A T_2(S) \qquad [III]$$

estimating the pure components $T_2(S)$ in the frequency domain [III] by means of linear programming, constrained convex programming or constrained quadratic programming, or provided that mixtures data X [I] are mass spectrometry data, constructing analytical continuation of the real data X as represented in equation [IV]

$$\tilde{X} = X + jH(X) \qquad [IV]$$

where H(X) represents Hilbert transform of X and $j=\sqrt{-1}$ represents imaginary unit, detecting the single component points in the analytical continuation [IV] where only one pure component is active by means of direction based criterion [V], $$\left| \frac{R\{\tilde{x}_t\}^T I\{\tilde{x}_t\}}{\|R\{\tilde{x}_t\}\| \|I\{\tilde{x}_t\}\|} \right| \geq \cos(\Delta\theta) \qquad [V]$$

where Δθ is some predefined angular displacement, estimating the number of pure components S present in the mixtures using any two out of n≧2 mixtures from the set of detected single component points in recorded mixtures [I] by means of a clustering function, estimating the concentration matrix A from the set of detected single component points in recorded mixtures [I] by means of a data clustering algorithm, estimating the pure components from recorded mixtures [I] by means of linear programming, constrained convex programming or constrained quadratic programming, and outputting output data including an identification of the estimated pure components to an output device for displaying or storing output data.

2. The method of claim 1, further comprising selecting estimated pure components in accordance with a negentropy-based ranking criterion.

3. The method of claim 1, wherein the transform $T_1$ is a wavelet transform with the symmlet wavelet of order 4 to 16.

4. The method of claim 3, wherein the transform $T_2$ is a Fourier transform.

5. The method of claim 1, wherein single component points are detected using direction based criterion [V] in wavelet domain [II], when recorded data [I] are NMR spectroscopy data.

6. The method of claim 1, wherein the clustering function is capable of estimating the number of pure components from the set of detected single component points in wavelet domain [II] and any two out of n≧2 mixtures.

7. The method of claim 1, wherein the data clustering algorithm is capable of estimating the concentration matrix from the set of detected single component points in the wavelet domain [II] by means of standard data clustering algorithms selected from the group consisting of k-means clustering, hierarchical clustering, fuzzy c-means clustering, etc.

8. The method of claim 1, wherein a numerical method is used to estimate the pure components in the frequency domain [III] that is a linear programming method, a convex programming method with quadratic constraint ($l_2$-norm based constraint) or a quadratic programming method with $l_1$-norm based constraint.

9. The method of claim 1, wherein single component points are detected using direction based criterion [V] using analytical continuation [IV], when recorded data [I] are mass spectrometry mixtures.

10. The method of claim 1, wherein the clustering function is capable of estimating the number of pure components from the set of detected single component points in recorded mass spectrometry mixtures domain [I] and any two out of n≧2 mixtures.

11. The method of claim 1, wherein the data clustering algorithm is capable of estimating the concentration matrix from the set of detected single component points in the recorded mass spectrometry mixtures domain [I] by means of standard data clustering algorithms selected from the group consisting of k-means clustering, hierarchical clustering, and fuzzy c-means clustering.

12. The method of claim 1, wherein a numerical method is used to estimate the pure components in the recording domain [I] that is a linear programming method, a convex programming method with quadratic constraint ($l_2$-norm based constraint) or a quadratic programming method with $l_1$-norm based constraint.

13. The method of claim 1, wherein said method is applied to the identification of the compounds in chemical synthesis, food quality inspection or pollution inspection.

14. The method of claim 1, wherein said method is applied to the identification of compounds obtained from natural sources (microorganisms, plants and animals), metabolites and biomarkers present in biological fluids (urine, blood plasma, cerebrospinal fluid, saliva, amniotic fluid, bile, tears, etc.) or tissue extracts.

15. Non-transitory computer-readable medium having computer-executable instructions stored thereon for:

receiving two or more mixtures data X from a mixtures sensing device wherein a recording domain of the mixture data is defined by equation [I]:

$$X = AS \qquad [I]$$

where S is an unknown matrix of pure components and A is an unknown mixing or concentration matrix, storing the recorded two or more mixtures data in a data storing device, provided that mixtures data X [I] are 1D or 2D NMR spectroscopy data, transforming the mixtures data X into a wavelet domain by using wavelet transform $T_1$ wherein two or more transformed mixtures $T_1(X)$ are represented by equation [II]:

$$T_1(X) = A T_1(S) \qquad [II]$$

and pure components in the wavelet representation domain defined by equation [II] are sparser than in recording domain defined by equation [I], detecting the single component points in the wavelet domain [II] $T_1$ where only one pure component is active according to direction based criterion [V], $$\left|\frac{R\{T_1(x_t)\}^T I\{T_1(x_t)\}}{\|R\{T_1(x_t)\}\|\|I\{T_1(x_t)\}\|}\right| \geq \cos(\Delta\theta) \qquad [V]$$

where for the same predefined angular displacement $\Delta\theta$ significantly more single component points will be identified in wavelet domain [II] than Fourier domain [III], estimating the number of pure components S present in the mixtures using two out of $n \geq 2$ mixtures from the set of detected single component points in wavelet domain defined by equation [II] by means of a clustering function, estimating the concentration matrix A from the set of detected single component points in wavelet domain defined by equation [II] by means of a data clustering algorithm, transforming 1D or 2D NMR mixtures data [I] into frequency domain by using Fourier transform $T_2$ wherein the transformed mixtures are represented by equation [III]:

$$T_2(X) = AT_2(S) \qquad [III]$$

estimating the pure components $T_2(S)$ in the frequency domain [III] by means of linear programming, constrained convex programming or constrained quadratic programming, or provided that mixtures data X [I] are mass spectrometry data, constructing analytical continuation of the real data X as represented in equation [IV]

$$\tilde{X} = X + jH(X) \qquad [IV]$$

where $H(X)$ represents Hilbert transform of X and $j = \sqrt{-1}$ represents imaginary unit, detecting the single component points in the analytical continuation [IV] where only one pure component is active by means of direction based criterion [V], $$\left|\frac{R\{\tilde{x}_t\}^T I\{\tilde{x}_t\}}{\|R\{\tilde{x}_t\}\|\|I\{\tilde{x}_t\}\|}\right| \geq \cos(\Delta\theta) \qquad [V]$$

where $\Delta\theta$ is some predefined angular displacement, estimating the number of pure components S present in the mixtures using any two out of $n \geq 2$ mixtures from the set of detected single component points in recorded mixtures [I] by means of a clustering function, estimating the concentration matrix A from the set of detected single component points in recorded mixtures [I] by means of a data clustering algorithm, estimating the pure components from recorded mixtures [I] by means of linear programming, constrained convex programming or constrained quadratic programming, and outputting output data including an identification of the estimated pure components to an output device for displaying or storing output data.

16. System for blind extraction of more pure components than mixtures in 1D or 2D NMR spectroscopy and mass spectrometry by means of sparse component analysis and detection of single component points, comprising:

an instruction executing computer having a data storing device, a processor, and an output device;

a mixtures sensing device for recording mixtures data X, said data storing device receiving and storing the mixture data X recorded by the mixtures sensing device, instructions executed on said a processor for processing the mixtures data X stored in the data storing device for, provided that mixtures data X [I] are 1D or 2D NMR spectroscopy data, transforming the mixtures data X into a wavelet domain by using wavelet transform $T_1$ wherein two or more transformed mixtures $T_1(X)$ are represented by equation [II]:

$$T_1(X) = AT_1(S) \qquad [II]$$

and pure components in the wavelet representation domain defined by equation [II] are sparser than in recording domain defined by equation [I], detecting the single component points in the wavelet domain [II] $T_1$ where only one pure component is active according to direction based criterion [V], $$\left|\frac{R\{T_1(x_t)\}^T I\{T_1(x_t)\}}{\|R\{T_1(x_t)\}\|\|I\{T_1(x_t)\}\|}\right| \geq \cos(\Delta\theta) \qquad [V]$$

where for the same predefined angular displacement $\Delta\theta$ significantly more single component points will be identified in wavelet domain [II] than Fourier domain [III], estimating the number of pure components S present in the mixtures using two out of $n \geq 2$ mixtures from the set of detected single component points in wavelet domain defined by equation [II] by means of a clustering function, estimating the concentration matrix A from the set of detected single component points in wavelet domain defined by equation [II] by means of a data clustering algorithm, transforming 1D or 2D NMR mixtures data [I] into frequency domain by using Fourier transform $T_2$ wherein the transformed mixtures are represented by equation [III]:

$$T_2(X) = AT_2(S) \qquad [III]$$

estimating the pure components $T_2(S)$ in the frequency domain [III] by means of linear programming, constrained convex programming or constrained quadratic programming, or provided that mixtures data X [I] are mass spectrometry data, constructing analytical continuation of the real data X as represented in equation [IV]

$$\tilde{X} = X + jH(X) \qquad [IV]$$

where $H(X)$ represents Hilbert transform of X and $j = \sqrt{-1}$ represents imaginary unit, detecting the single component points in the analytical continuation [IV] where only one pure component is active by means of direction based criterion [V], $$\left|\frac{R\{\tilde{x}_t\}^T I\{\tilde{x}_t\}}{\|R\{\tilde{x}_t\}\|\|I\{\tilde{x}_t\}\|}\right| \geq \cos(\Delta\theta) \qquad [V]$$

where $\Delta\theta$ is some predefined angular displacement, estimating the number of pure components S present in the mixtures using any two out of $n \geq 2$ mixtures from the set of detected single component points in recorded mixtures [I] by means of a clustering function, estimating the concentration matrix A from the set of detected single component points in recorded mixtures [I] by means of a data clustering algorithm, estimating the pure components from recorded mixtures [I] by means of linear programming, constrained convex programming or constrained quadratic programming, and outputting output data including an identification of the estimated pure components to an output device for displaying or storing output data.

17. The system of claim 16, wherein the mixtures sensing device is a nuclear magnetic resonance (NMR) spectrometer or mass spectrometer.

18. The system of claim 17, further comprising instructions executed on said processor for selecting estimated pure components in accordance with a negentropy-based ranking criterion.

19. The system of claim 18, wherein the transform $T_1$ is a wavelet transform with the symmlet wavelet of order 4 to 16.

* * * * *